US005286343A

United States Patent [19]

Hui

[11] Patent Number: 5,286,343
[45] Date of Patent: Feb. 15, 1994

[54] METHOD FOR PROTECTING CHIP CORNERS IN WET CHEMICAL ETCHING OF WAFERS

[75] Inventor: Wing C. Hui, Campbell, Calif.

[73] Assignee: Regents of the University of California, Oakland, Calif.

[21] Appl. No.: 918,601

[22] Filed: Jul. 24, 1992

[51] Int. Cl.$^5$ .................. H01L 21/306; B44C 1/22
[52] U.S. Cl. .................. 156/647; 156/654; 156/659.1; 156/661.1; 156/662; 156/345
[58] Field of Search ............... 156/345, 647, 654, 657, 156/659.1, 661.1, 662

[56] References Cited

U.S. PATENT DOCUMENTS 3,728,179 4/1973 Davidson et al. .................. 156/647
4,172,005 10/1979 Muraoka et al. .................. 156/647

OTHER PUBLICATIONS

"Corner Compensation Techniques In Anisotropic Etching of (100)-Silicon Using Aqueous KOH" by H. Sandmaier et al., Intl Conf . . . Actuator 1991, pp. 456–459.
"Compensation Corner Undercutting In Anisotropic Etching of (100) Silicon" by Wu et al., Sensors and Actuators 18:207–215 (1989).
"Fabrication of Non–Underetched Convex Corners In Anisotropic Etching of (100)-Silicon In Aqueous KOH With Respect to Novel Micromechanical Elements" by Mayer et al., J. Electrochem, Soc. 137:3947–3951 (1990).
"Mesa Structure Formation Using Potassium Hydroxide and Ethylene Diamine Based Etchants" by Chang et al., IEEE Workshop 1988, pp. 102–103.
"A Study On Deep Etching Of Silicon Using EPW", by Wu et al., Int'l Conference On Solid-State Sensors & Actuators, 1985 pp. 291–294.
"Corner Compensation Structures For (110) Oriented Silicon" by D. R. Ciarlo, IEEE Proceedings of Micro Robots & Teleoperators Workshop, 1987.
"Silicon As A Mechanical Material" by Kurt Peterson, Proceedings Of the IEEE 70:420–457 (May 1982).

Primary Examiner—William A. Powell
Attorney, Agent, or Firm—Daryl S. Grzybicki; Henry P. Sartorio

[57] ABSTRACT

The present invention is a corner protection mask design that protects chip corners from undercutting during anisotropic etching of wafers. The corner protection masks abut the chip corner point and extend laterally from segments along one or both corner sides of the corner point, forming lateral extensions. The protection mask then extends from the lateral extensions, parallel to the direction of the corner side of the chip and parallel to scribe lines, thus conserving wafer space. Unmasked bomb regions strategically formed in the protection mask facilitate the break-up of the protection mask during etching. Corner protection masks are useful for chip patterns with deep grooves and either large or small chip mask areas. Auxiliary protection masks form nested concentric frames that etch from the center outward are useful for small chip mask patterns. The protection masks also form self-aligning chip mask areas. The present invention is advantageous for etching wafers with thin film windows, microfine and micromechanical structures, and for forming chip structures more elaborate than presently possible.

39 Claims, 19 Drawing Sheets

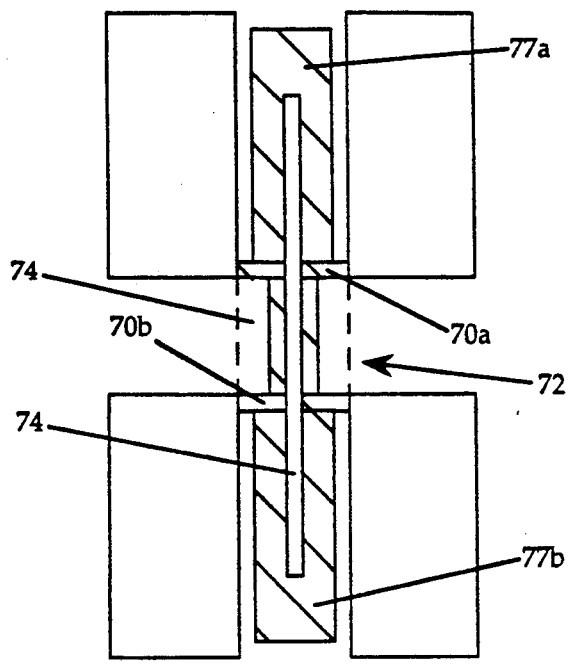
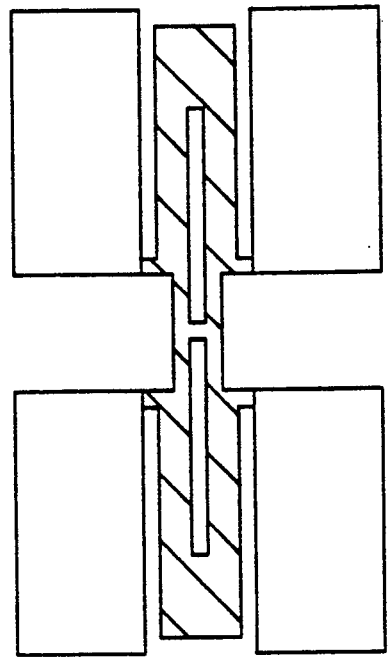
Figure 13A
Figure 13B
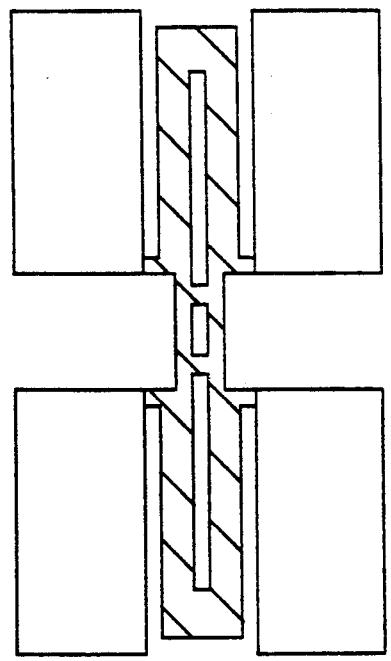
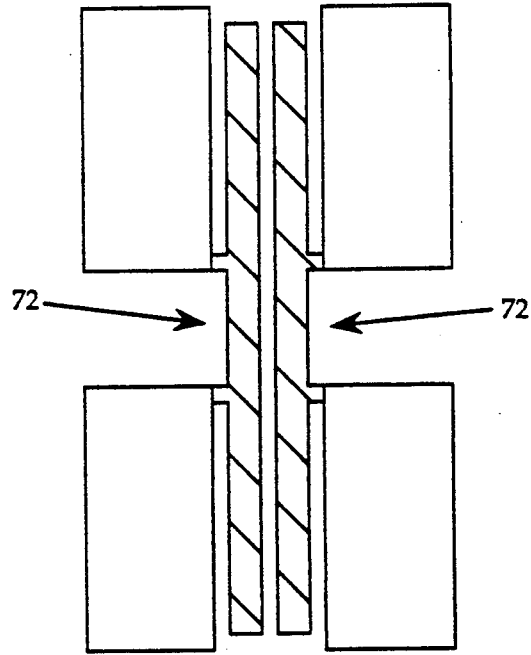
Figure 13C
Figure 13D

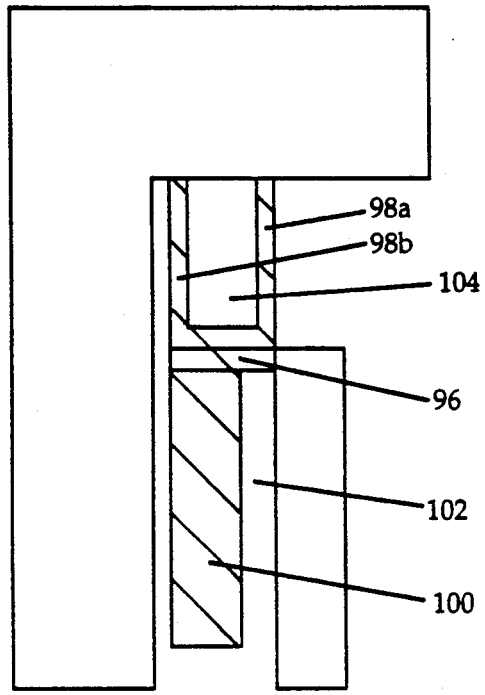
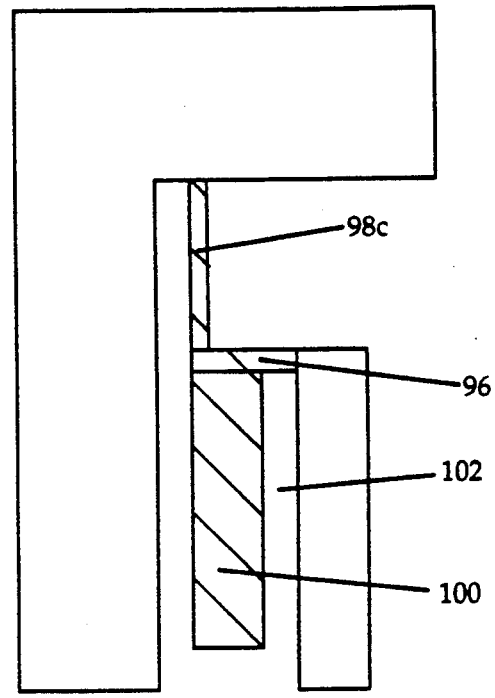
Figure 17A
Figure 17B
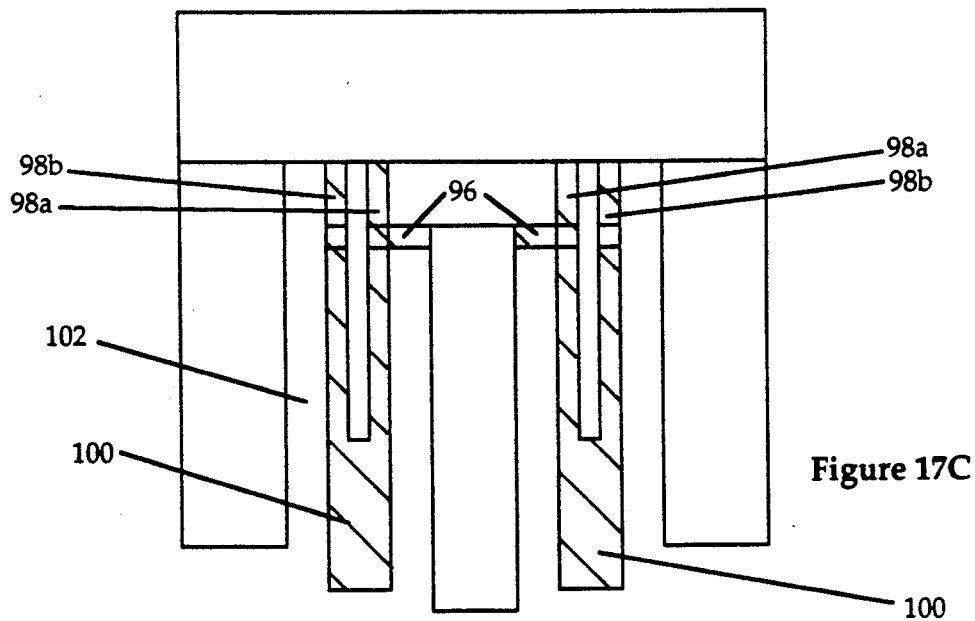
Figure 17C

METHOD FOR PROTECTING CHIP CORNERS IN WET CHEMICAL ETCHING OF WAFERS

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to wet chemical etching of wafers. In particular, the present invention relates to improved space-saving mask designs that prevent undercutting at feature area corners when forming deep grooves using anisotropic etching methods.

In the semiconductor industry, wafers that have integrated circuits on them are generally separated into chips with a diamond saw, or sometimes by scribing and cleaving. With the recent introduction of chips having micromechanical devices or thin film windows, sawing tends to be wasteful because the devices are fragile and can be easily broken while sawing the wafer. To alleviate this problem, these wafers are separated by scribing and cleaving. Scribe lines are generally made using anisotropic etching techniques, but problems with undercutting arise because the chip corners are not along well-defined crystal planes.

For example, in typical anisotropic etching of silicon (100) wafers, the chip mask patterns are usually bounded by masks with edges along the (111) planes. The (111) planes etch much more slowly than other planes when using certain etchants and thus serve as effective etch-stops along the edges of the chip masks. However, chip corners do not line up with the (111) planes, and although concave corners also serve as etch-stops, convex corners will etch much more quickly than the mask boundaries along the (111) planes. This preferential etching causes considerable undercutting at the convex corners of the chip masks when etching deep grooves.

Corner undercutting is particularly troubling for two types of chip mask patterns. The first pattern has large chip areas, preferably with deep, narrow grooves between the chips. The second pattern has very small chip areas with deep, wide grooves between the chips. The development of corner compensation techniques reduces or eliminates the undercutting of chip corners while etching deep grooves.

The conventional corner compensation method for (100) silicon wafers involves forming a mask extension directed away from a chip mask corner along the (111) direction. The convex corners on the end of the extension are undercut and etched away, causing the extension to shorten. The length of the extension is formed to be completely etched when the groove has reached the proper depth. Etching is stopped before the chip corners are undercut.

Conventional mask extensions are straight and extend from the corners of the mask and lay across the adjacent scribe lines. Since a longer etching time increases the necessary length of the extensions, etching deeper grooves requires the extensions to be longer to avoid undercutting at the corners. Consequently, deeper grooves must also be wider because the extensions must be long and lie across the region where the groove is formed. This wide spacing between the masks due to the length of the extensions results in a large amount of wasted wafer space. This corner compensation technique is also unsuitable for producing high quality scribe lines, which are needed at boundaries between chip areas having delicate micromechanical devices or thin film windows.

Even in small chip patterns, which require deep, wide grooves, and where much unmasked wafer space surrounds the chip masks, the conventional corner compensation technique still may not protect chip corners adequately. Plenty of space exists in these patterns to form long extensions by the conventional technique, but these extensions, unfortunately, are very narrow. Narrow extensions are formed since the extensions are narrower in width than the chip itself, which already has a small area. These long, thin extensions are undercut too rapidly to create deep grooves and preserve the chip corners.

Different variations on the mask extension theme have been developed. The Wu method uses extensions bounded by beveling planes at the chip corners (Wu et al., *Sensors and Actuators* 18:207 (1989)). Chang et al. describe the use of compensation "streets", in which compensation areas abut the sides of the chips, forming straight extensions at the chip corners at a 45° angle to the chip sides (Solid-State Sensor and Actuator Workshop, June 6–9, 1988). Mayer et al. developed compensation structures in which the main element is a straight masked band extending at an angle from a chip corner (*J. Electrochem. Soc.* 137:3947 (December 1990)). The two long sides of this band fan out into narrow beams.

All of these corner compensation structures are inadequate for large chip patterns because of space considerations. The mask extensions, whether formed into streets or a fan of beams, or bounded by beveled planes, leave open space that limits the compactness of chips on a wafer. Conventional techniques produce wafers with either deep, narrow grooves and an unacceptable amount of undercutting at convex corners or deep, wide grooves without undercutting at the corners. Both choices have serious deficiencies.

Conventional techniques are also inadequate for small chip patterns, for the mask extensions formed at the convex corners are extremely narrow and undercut too quickly to form deep, wide grooves. In particular, the chip area is too small to permit the formation of an elaborate fan of beams like the Mayer structures. Conventional methods produce either deep, wide grooves with unacceptable undercutting or shallow, wide grooves without undercutting. Again, the choices presented by the conventional compensation techniques do not protect the desired chip patterns.

Thus, a need exists for an improved method of eliminating undercutting at convex corners during the anisotropic etching of wafers. For large or small chip patterns, an improved method would save space on the individual chips and would increase the number of chips that are made from a wafer. Also, the advent of new, mechanically delicate chips requires a gentle method of separating wafers into chips. The present invention solves all these problems by providing a method of making narrow or wide deep grooves without undercutting the chip area corners. A greater variety of elaborate, customized, and microfine structures on wafers become possible using the present invention.

SUMMARY OF THE INVENTION

The present invention is a mask pattern that prevents undercutting of chip and window frame corners during anisotropic etching of wafers. The pattern includes corner protection masks, which extend laterally from the convex corners of the feature areas and further extend in a second direction, parallel to the sides of the feature areas. The protection masks include unmasked bomb regions which facilitate the undercutting of the protection mask. The protection masks are modified for use with chips or window frames of different sizes and geometry and to produce grooves of differing width and depth for scribe lines.

The present invention has many objectives:

to provide a method for eliminating undercutting at convex corners of chips and window frames during anisotropic etching of wafers to preserve the original feature area, to increase the yield of chips by providing a nondestructive way of separating wafers into chips, to optimize the use of space on wafers with mask designs that are more space-efficient than conventional corner compensation techniques, to provide a method for forming deep, wide grooves with small chip mask patterns, to provide a method for making thin membrane windows with narrow window frames, and to provide a method that allows chips to contain microfine structures and micromechanical devices that are more elaborate than presently possible.

The objects of the invention are realized with a corner protection mask which abuts at least one chip or window frame corner point and a segment along one or both sides of the corner. The protection mask extends laterally from the corner side to form a lateral extension, and then extends from the lateral extension in a second direction, parallel to the corner side. Unmasked bomb regions are formed in the protection mask. Other embodiments of the protection masks form extension arms that are oriented to conserve space or auxiliary masks that form nested, concentric frames.

Two main aspects of the corner protection mask should be emphasized. First, the protection masks extend parallel to the grooves, not across them. Wafers with this protection mask configuration have closely packed chip masks. Second, since the corner protection mask extends laterally from chip corners and then extends parallel to the sides of the chip masks, the corner protection mask must change direction at some point. Normally, this change in direction would give rise to either a convex angle or a curve not along an etch-stop direction. During etching, the anisotropic etchant would act on this portion, and undercutting would reach the corner too soon, before the proper groove depth was reached. In the present invention, the protection masks are designed to avoid forming vulnerable corners as the mask changes direction.

Changing the direction of the protection mask to extend parallel to the corner sides of the chip masks permits relatively lengthy protection masks with closely packed chips. Because the length of the protection masks predominantly determines the allowable groove depth before corner undercutting occurs, the grooves of the present invention need not be made wide to make them deep. Advantageously, deep, narrow grooves may be formed as the protection masks are undercut and etched away. A significant amount of wafer space is saved when etching grooves for scribe lines, and the sharp corners of the chips are preserved, saving the original chip design.

Another feature of the corner protection mask is used to better time the desired depth of etching for grooves with the elimination of the protection mask. Unmasked bomb regions are formed strategically in the protection mask to facilitate etching. During etching, the anisotropic etchant first attacks the convex corners of the protection masks. When the etching front reaches the unmasked regions, the protection mask "opens up" and exposes more convex corners for undercutting. In this way, the unmasked regions facilitate the undercutting of the corner protection mask, so deep grooves are etched without undercutting feature area corners.

The dimensions and geometry of the corner protection mask and unmasked regions can be varied to insure that the protection mask is etched away when the grooves reach the proper depth. Longer and wider protection masks require more etching time for elimination. Narrow protection masks may be preferred to more accurately control etching time and to make narrow grooves. However, for some chip patterns, narrow protection masks will etch away too quickly, not allowing enough time to etch deep grooves.

The corner protection mask conforms to small chip patterns with wide grooves and large chip patterns with narrow grooves. The general protection mask form also forms self-aligning feature areas. The different embodiments are modified to prevent undercutting of corners before etching is complete. These variations are best understood following more detailed description of the alternative embodiments with reference to the drawings.

BRIEF DESCRIPTION OF THE DRAWINGS

FIGS. 12A-12C and 13A-13D show embodiments of corner protection masks suitable for large chip mask patterns.

FIGS. 17A–17C and 18A–18D show embodiments of corner protection masks with chips masks of different sizes and configurations.

DETAILED DESCRIPTION OF THE INVENTION

The present invention is a mask pattern with corner protection masks for protecting chip or window frame corners on wafers of different compositions and different crystal orientations. In particular, the present invention can be applied to (100) and (110) silicon wafers. Many embodiments of the corner protection mask are possible because of the wide variety of chip and window configurations, which each suggest many different protection mask designs. Chips are the preferred embodiment, but the protection masks are applicable to both types of feature areas—chips and windows. Chips include feature areas with microfine structures or micromechanical devices.

Figure 1:
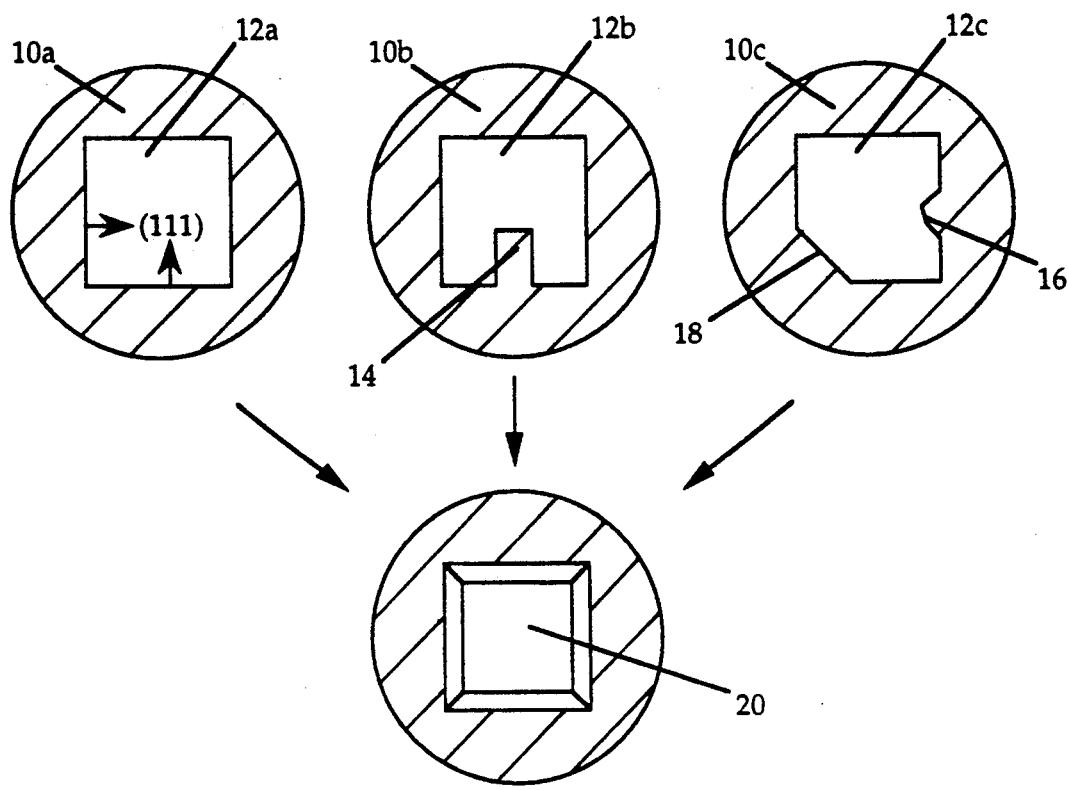
FIG. 1 illustrates basic principles of anisotropic etching of silicon (100) wafers.

FIGS. 1–4 illustrate the basic principles of anisotropic etching by showing schematically how a mask on a (100) silicon wafer will be undercut to (111) planes during etching. FIG. 1 is a top view of masks 10a, 10b, 10c with differently shaped central openings 12a, 12b, 12c. During etching, no undercutting occurs along the (111) planes or at the concave inner corners of the masks. The etchant acts instead on non-(111) planes, such as convex corners. The rectangular protrusion 14 of the second mask 10b has two convex outer corners, which are undercut to a (111) plane during etching. The third mask 10c has a convex curve 16 and a plane 18 not parallel to the (111) plane. These non-(111) planes will also be undercut until reaching a (111) plane.

FIG. 1 illustrates that any non-(111) planes will be undercut back and a polyhedral pit 20 will be formed in the wafer, bounded by etch-stop (111) planes. This principle is important in understanding that the masked and unmasked regions of the mask pattern can be formed in a variety of shapes and sizes, and etching (with the appropriate etchant) continues until the etch fronts meet (111) planes. Strictly speaking, the (111) planes also etch, but the etch rate is negligible compared to the etch rate of the other planes.

Figure 2A:
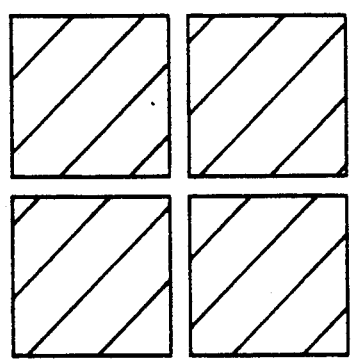
FIGS. 2A and 2B show the effects of anisotropic etching on unprotected chip mask corners.
Figure 2B:
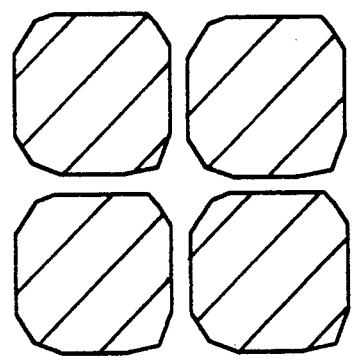

FIGS. 2A–2B show the effect of anisotropic etching on an array of square chip masks. FIG. 2A shows a top view of the original array. During anisotropic etching, the convex corners are severely undercut, and the final chips are not rectangular at all, as shown in FIG. 2B. Not only is considerable useful chip area lost, but if the etching is to produce grooves for scribe lines, the lines are not clear and even. Clear lines are important for the new fragile chips with micromechanical devices and thin film windows.

Figure 3A:
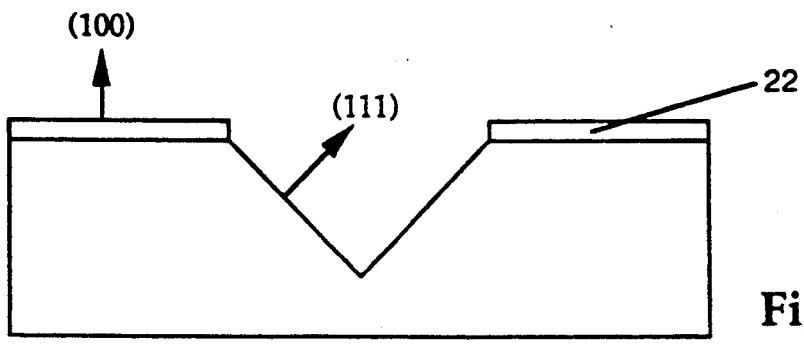
FIGS. 3A-3D show cross-sections of an etched wafer with and without an undercut chip mask.
Figure 3B:
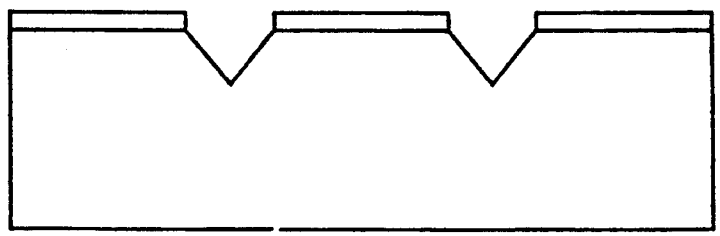
Figure 3C:
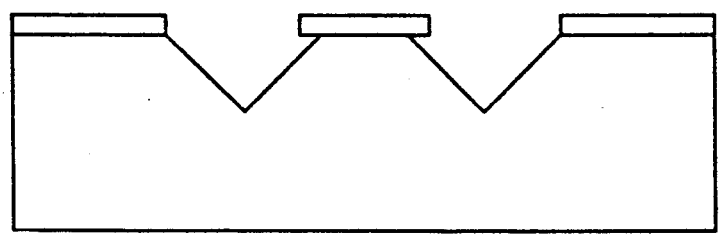
Figure 3D:
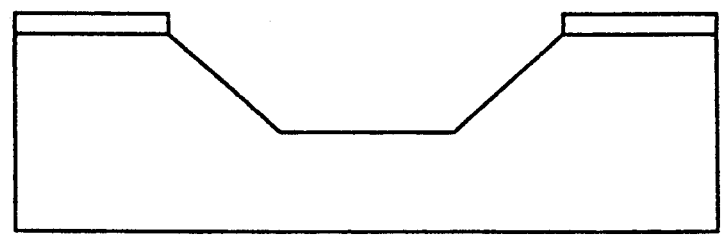

FIG. 3A is a cross-sectional view of a (100) silicon wafer, showing a typical pyramidal pit bounded by etch-stop (111) planes etched through an opening in an oxide mask 22. FIG. 3B shows grooves etched on either side of a chip mask area whose corners are not undercut. FIG. 3C shows the undercutting of unprotected chip mask convex corners. If etching continues unchecked, the chip mask will be completely undercut, leaving one wide polyhedral groove or pit, as shown in FIG. 3D.

Figure 4A:
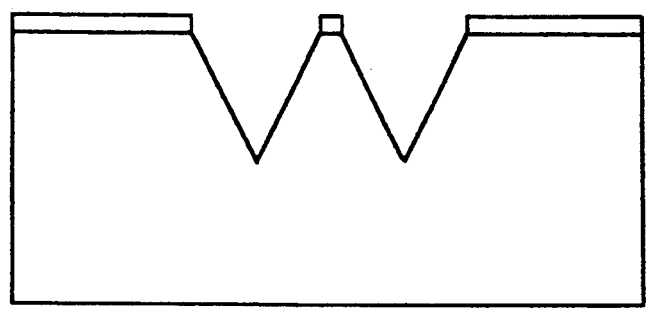
FIGS. 4A and 4B show cross-sections of a deeply etched wafer with a small chip mask.
Figure 4B:
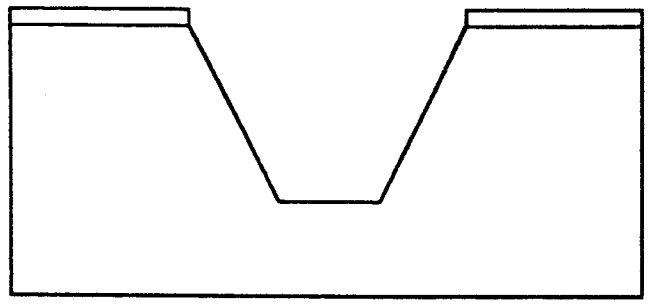

FIG. 4A is a cross-sectional view of a wafer with a very small chip mask area, deep grooves, and no undercutting. FIG. 4B illustrates a deep trench resulting from complete undercutting of a small chip mask. Corner protection is especially important for these small chip patterns, for any undercutting severely limits the useful chip area. This undercutting especially affects chips with thin film windows, because the wafers are etched completely through during manufacturing. In order to preserve the original areas of a chip pattern, all convex corners in the original pattern must be protected from undercutting.

Figure 5A:
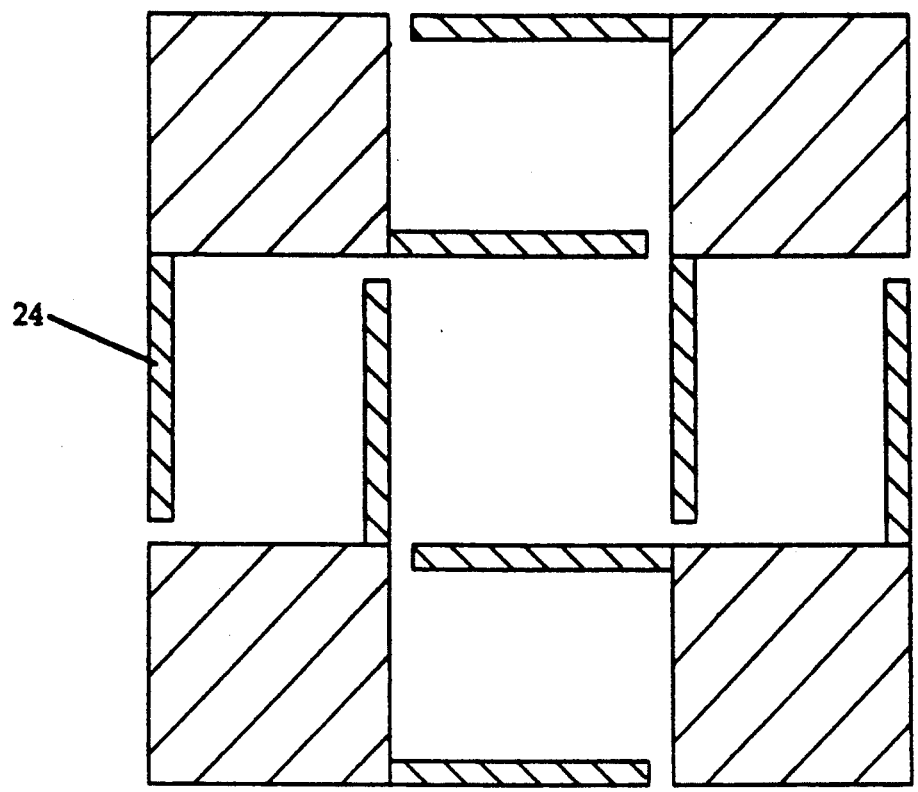
FIGS. 5A-5B show the chip spacing with a conventional corner compensation design (FIG. 5A) and with corner protection masks of the present invention (FIG. 5B).

FIG. 5A shows a conventional corner protection mask design. Mask extensions 24 are added to each chip corner, providing a substitute pair of convex corners for each chip corner. The extensions 24 are designed to be undercut back to the chip corners when groove etching is complete. The extensions 24 lie across unmasked wafer space, which wastes space and makes chip compactness impossible. The resulting grooves for scribe lines are not sharp and clear, as required for the new mechanically delicate devices being developed today.

Figure 5B:
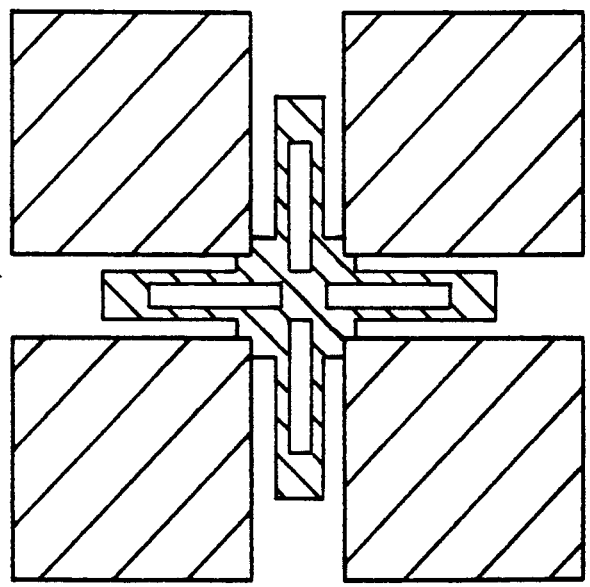

FIG. 5B shows the space-saving feature of an embodiment of the present corner protection mask design. Instead of lying across unmasked wafer space, the corner protection masks form cruciforms at the intersections of the chip masks and extend parallel to the sides of the chips. The protection masks are designed to be undercut back to the chip corners at the same time groove etching is finished. In this way, wafer space is saved, and the etched lines will be deep and narrow with well-defined corners. A wafer with scribe lines made according to the present invention may be cleaved easily, making the present technique suitable for scribing wafers with micromechanical structures and thin film membrane windows with narrow frames.

Figure 6:
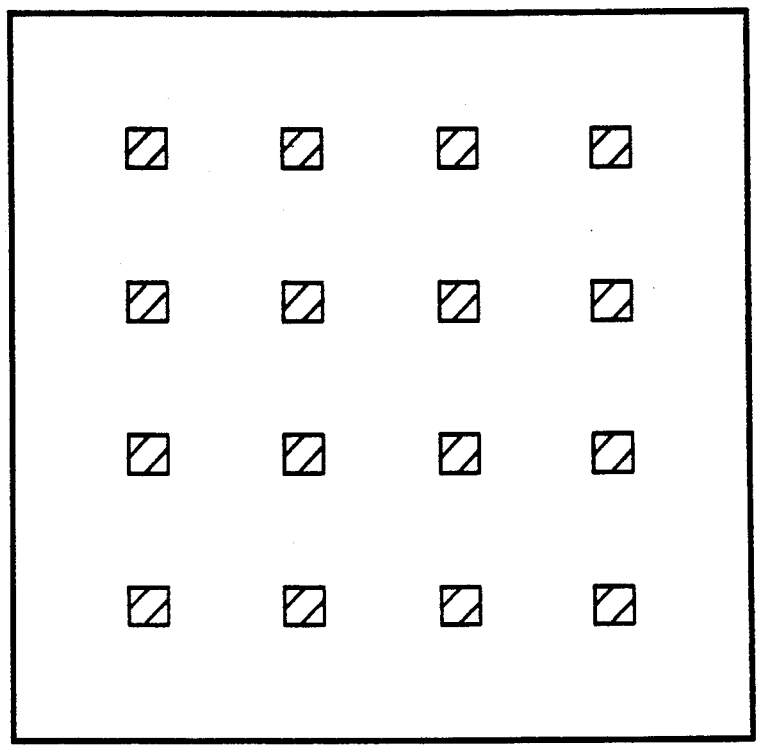
FIG. 6 shows a small chip mask array.
Figure 7:
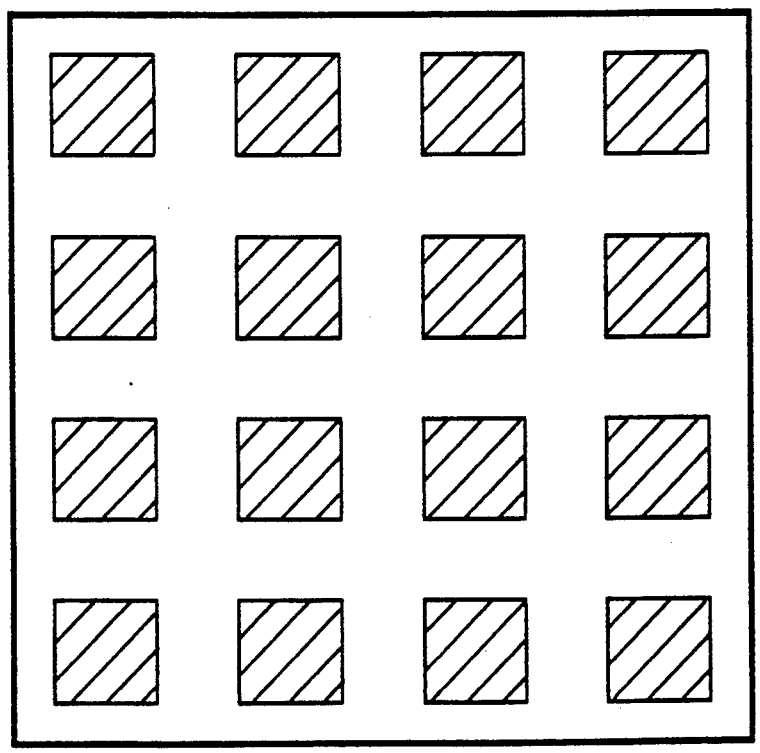
FIG. 7 shows a large chip mask array.

Two basic chip patterns are usually etched: small chip areas with wide, deep grooves, as shown in FIG. 6, and large chip areas with narrow, deep grooves, as shown in FIG. 7. In small chip patterns, the ratio of feature area length to groove width is defined as less than or equal to 1. The length-width ratio for large chip patterns is defined as greater than 1. The length of a small chip area is typically less than about 200 microns, and the groove width in a small chip pattern is typically greater than about 200 microns. Large chip patterns typically have a chip area length greater than about 200 microns and a groove width less than about 200 microns. Specific examples of patterns are provided:

| Patterns | Feature Area Length | Groove Width | Etch Depth* |
|---|---|---|---|
| Small | $\leq 100$ μm | $\geq 300$ μm | ~200 μm |
|  | $\leq 50$ | $\geq 400$ | ~270 |
| Large | $\geq 500$ | $\leq 100$ | ~200 |
|  | $\geq 1000$ | $\leq 100$ | ~400 |

*deepest part of the whole wafer, not just the grooves.

Figure 8A:
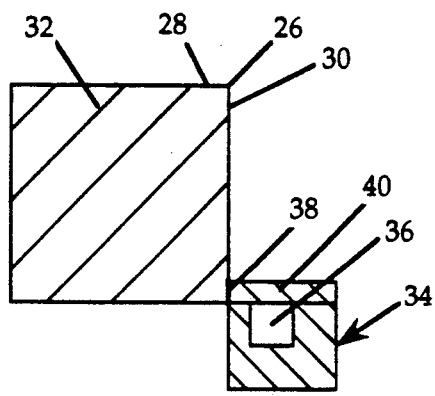
FIGS. 8A-8D show embodiments of corner protection masks suitable for large chip mask patterns.

FIGS. 8A–8D show different basic embodiments of the present corner protection mask, preferably for chip patterns with large chip mask areas. In general, a corner protection mask is a continuation of a chip mask and abuts a corner point and one or both sides of the protected convex corner. A corner point 26 is formed at the intersection of two corner sides 28,30 of a chip mask 32, as shown in FIG. 8A. The protection mask 34 extends laterally from a chip corner point and from a segment along at least one chip corner side. The protection mask then extends in a second direction, parallel to the corner side (the side which the protection mask abuts).

The corner protection masks include unmasked bomb regions 36, which facilitate the break-up of the protection mask during etching, so that the protection masks completely etch away when the grooves for scribe lines reach the desired depth. The unmasked bomb regions 36 may be of any shape and are preferably bounded by slow-etching or etch-stop planes. Etching fronts erode the convex corners of the protection masks and reach the unmasked bomb regions, causing the protection mask to "explode" by exposing new convex corners. The wafer is etched until the protection masks are reduced or eliminated, and the original chip corners are exposed but substantially intact.

FIG. 8A shows a corner protection mask 34 that abuts a chip corner point and a segment 38 along one chip corner side 30. The protection mask 34 extends laterally from the corner segment 38 and the corner point, forming a lateral extension 40. The protection mask then extends from the lateral extension 40 in a second direction, parallel to the corner side 30. An unmasked bomb region 36 is formed within the protection mask 34 to facilitate protection mask elimination and to control the timing of reaching the desired groove depth.

Figure 8B:
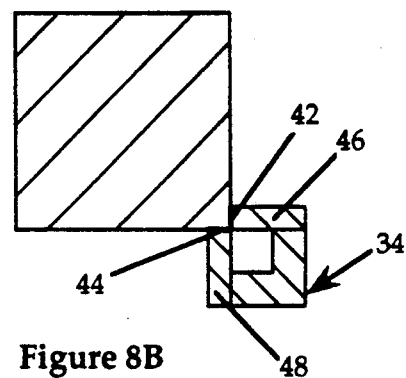

FIG. 8B illustrates a protection mask 34 that abuts a chip corner point and segments 42, 44 along both sides of the chip corner. The protection mask 34 extends laterally from both corner segments 42, 44, forming lateral extensions 46, 48, and then extends from the lateral extensions 46, 48 in directions parallel to the corner segments 42, 44. An unmasked bomb region 36 is formed at the corner point of the chip mask 34, between the lateral extensions 46, 48.

Because the structure of the protection mask is relatively simple, the two embodiments in FIGS. 8A-8B are useful for chip patterns with both large and small chip mask areas. A small chip area especially cannot support a corner protection mask with long, multiple extensions; intricate extensions etch away so quickly that chip corners are undercut before deep grooves are created.

Figure 8C:
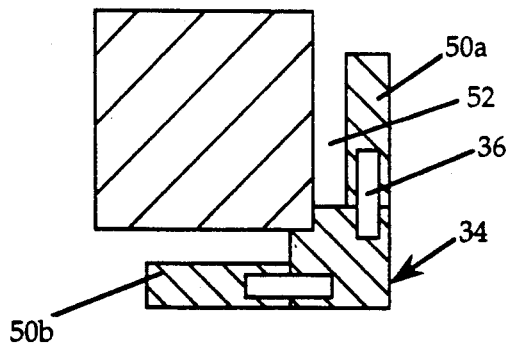

FIG. 8C depicts an expanded embodiment of a corner protection mask. As in FIG. 8B, the protection mask 34 abuts and extends laterally from a corner point and from segments along both corner sides of the chip corner. The protection mask 34 then extends in second directions, parallel to the respective corner sides of the chip. In FIG. 8C, the protection mask 34 then forms extension arms 50a,50b by extending in third directions, away from the abutted corner point and parallel to the chip side adjacent to the extension arm.

The extension arms 50a,50b are spaced away from the corner sides by an unmasked spacer region 52 between each extension arm 50a,50b and the adjacent chip side. The width of the extension arms 50a,50b is less than the length of the lateral extensions. The extension arms use wafer space around the chip masks efficiently, thereby permitting chips in large chip patterns to be closely compacted, which increases the chip yield of a single wafer. Portions of the unmasked bomb regions 36 are formed in the extension arms 50a, 50b.

Figure 8D:
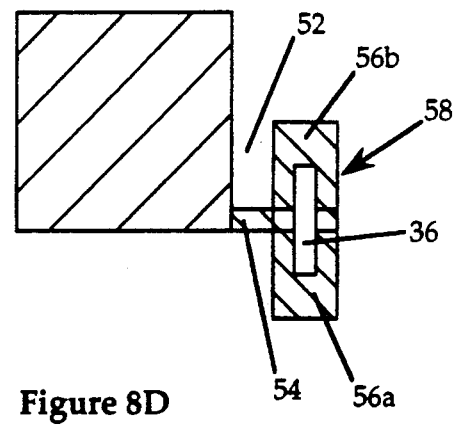

FIG. 8D illustrates an embodiment of the corner protection mask wherein the protection mask abuts a corner point and a segment along one corner side of the chip corner. The protection mask forms a lateral extension 54 from one side of the protected corner. The protection mask forms an extension arm 56a while extending in a second direction, parallel to the corner side of the chip. The protection mask extends in a third direction, parallel to the corner side of the chip and to the first extension arm 56a, to form a second extension arm 56b. The lateral extension 54 and extension arms 56a,56b from a central body 58. The extension arms 56a,56b are spaced away from the side of the chip by unmasked spacer regions 52 such that the width of the extension arms 56a,56b is less than the length of the lateral extension 54. An unmasked bomb region 36 is shown in the central body 58.

FIGS. 9A-9F represent the step-by-step undercutting of a corner protection mask of the type shown in FIG. 8C. FIG. 9A shows the pre-etched, original structure of the corner protection mask located in the intersection of four chip mask outer convex corners. In this embodiment, each protection mask abuts four chip mask corners. The mask pattern is exposed to an anisotropic etchant that is suitable for the particular composition and crystallography of the wafer.

FIG. 9B shows how etch fronts have eroded the convex corners of the protection mask extension arms back to the unmasked bomb regions. FIG. 9C shows the newly exposed convex corners after the extension arms are undercut and eliminated. At this point, eight convex corners are available for undercutting on the protection mask. Without the unmasked bomb regions, the corner protection mask would be bounded by etch-stop planes (e.g., (111) planes), and the necessary etching of grooves would cease.

FIG. 9D shows the progression of undercutting of the protection mask. Eventually, all linkages between the chip corners are eliminated, and the protection mask is reduced to an "island", as shown in FIG. 9E. At this point, the chip corners are only slightly undercut, if at all. If etching continues, the last remnant of the corner protection mask is eliminated. FIG. 9F shows the final structure of the array: the chip corners are undercut slightly more, but the corner protection mask has minimized the undercutting. The resulting grooves are narrow and deep, and the chip corners are essentially intact.

Figure 9:
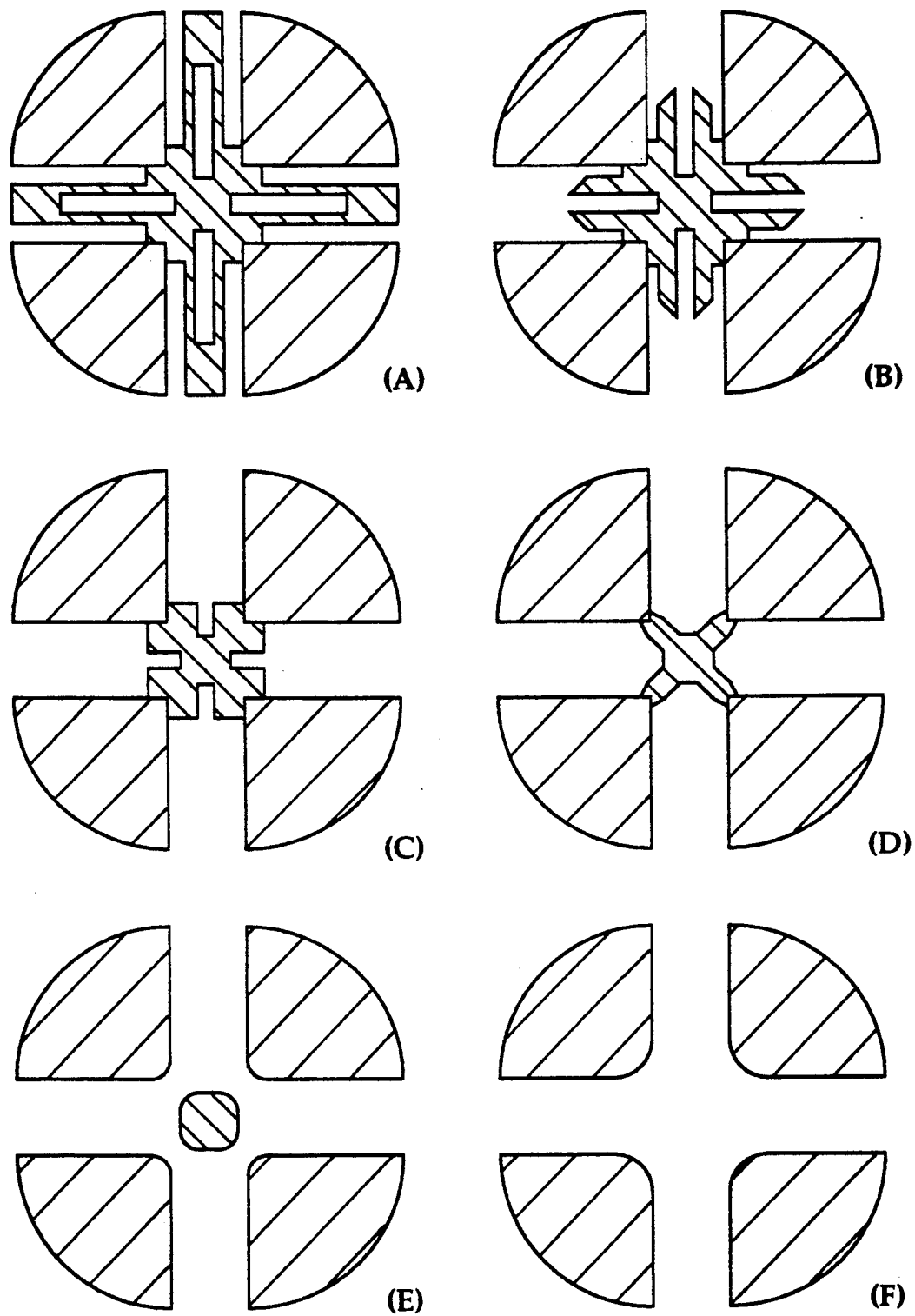
FIGS. 9(A)-9(F) illustrate the step by step undercutting of a corner protection mask during anisotropic etching.
Figure 10A:
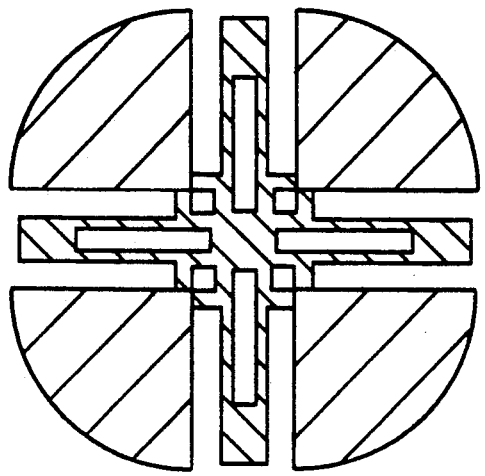
FIGS. 10A-10D show embodiments of the corner protection mask of FIG. 9(A).
Figure 10B:
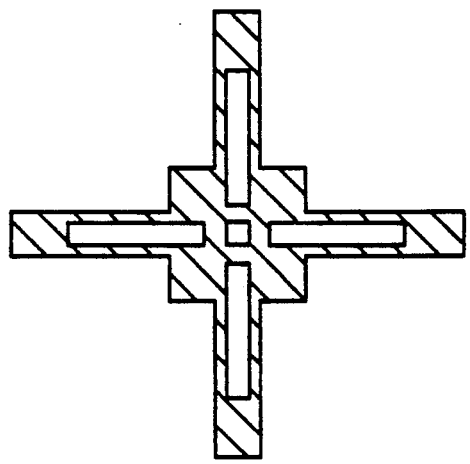
Figure 10C:
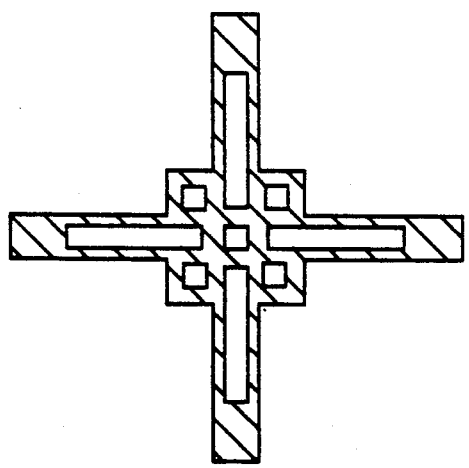
Figure 10D:
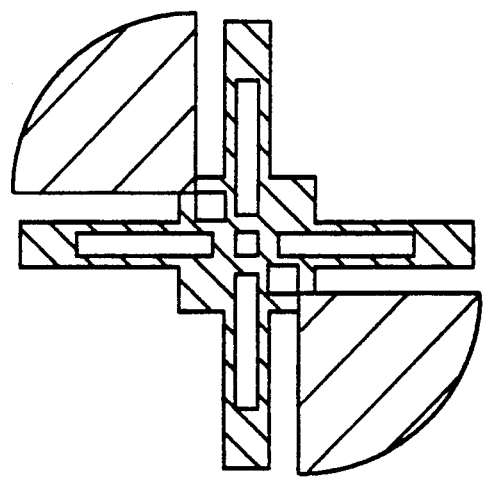

FIGS. 10A-10C show four embodiments of the protection mask of FIG. 9 with additional unmasked bomb regions, which are positioned to facilitate the break-up of the protection mask and thereby optimize etching time. FIGS. 10B-D include an unmasked bomb region 40 in the center of the protection mask, eliminating the need to undercut the "island" shown in FIG. 9E.

Figure 11:
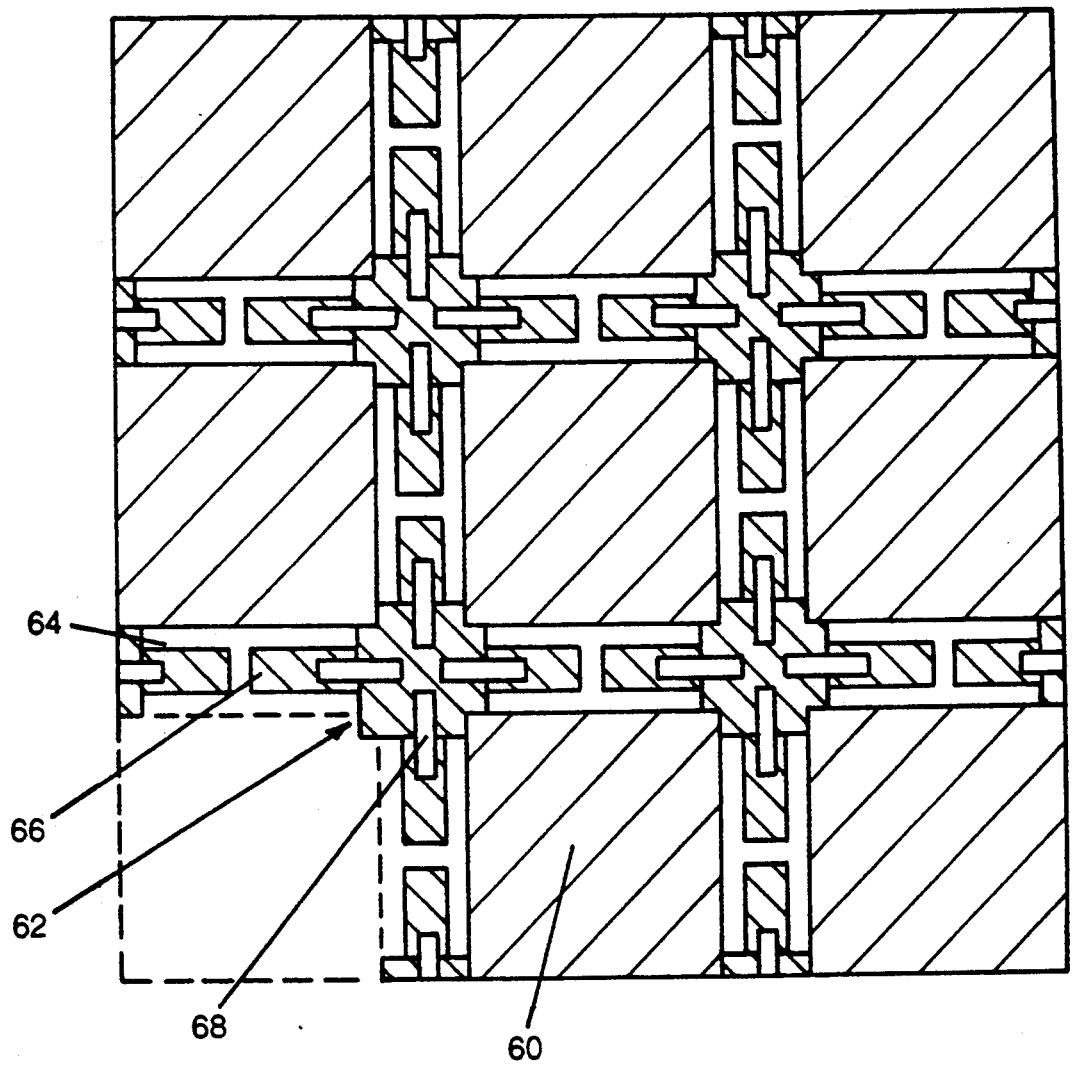
FIG. 11 shows an array of chip masks with an embodiment of the corner protection mask at chip corner intersections.

FIG. 11 shows an array of large chip masks 60 with the embodiment of the corner protection mask 62 shown in FIG. 9. A protection mask 62 extends from the convex corners of the chip masks 60 and from the corner sides of the chips into the intersection of unmasked wafer space 64. The protection mask 62 forms four extension arms 66 that are parallel to and spaced away from the chip sides. The extension arms 66 provide a temporary set of convex corners that are undercut when acted upon by an anisotropic etchant. The protection mask pattern is designed to be eliminated when grooves for scribe lines are formed at the desired depth. The array is cleaved along the grooves that define the scribe lines after the wafer is etched. The corner protection mask also includes unmasked bomb regions 68 formed so that etch fronts continually expose convex corners on the protection mask. The purpose of the unmasked regions is to "explode" the protection mask by exposing additional convex corners as the protection mask is undercut during etching.

Figure 12A:
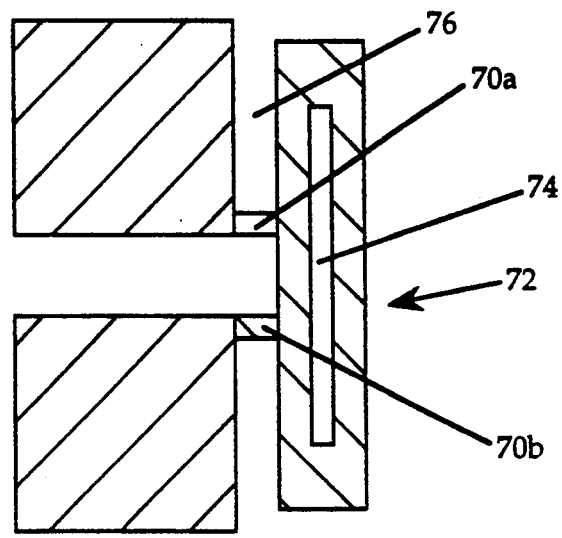
Figure 12B:
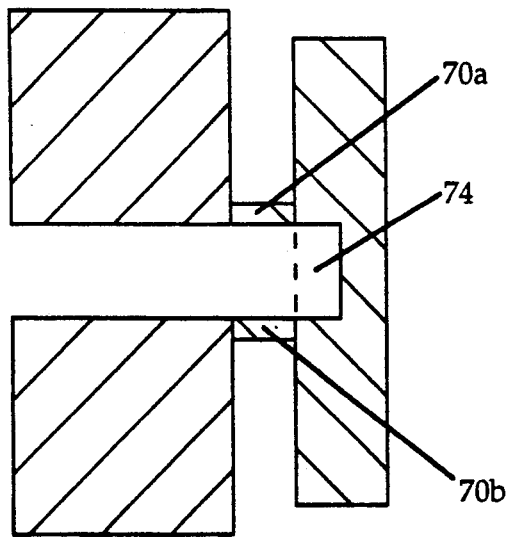
Figure 12C:
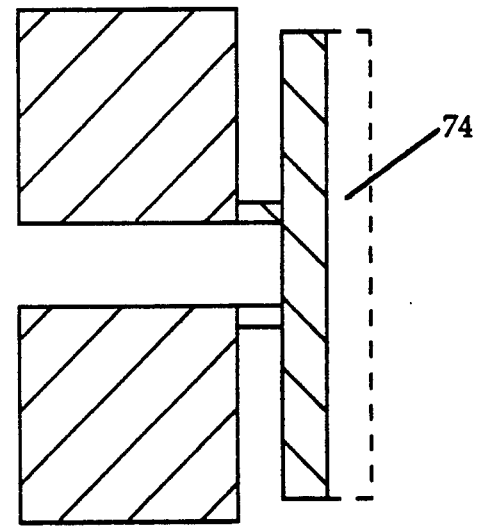

FIGS. 12A–12C illustrate other embodiments of corner protection masks which abut a plurality of chip masks and are particularly advantageous for large chip patterns. FIG. 12A shows a protection mask with lateral extensions 70a, 70b abutting two chip corners of two chip masks. The protection mask forms a central body 72 and includes a single unmasked bomb region 74. Unmasked spacer regions 76 separate the central body 72 from the adjacent chip mask sides. The lengthwise direction of the central body 72 is formed laterally along the length of two chip masks and not between the two facing chip sides. In this way, the central body 72 can be longer, at least one chip length, and preferably about two chip lengths, without sacrificing chip compactness.

FIGS. 12B–12C depict the chip masks and corner protection mask of FIG. 12A with modifications for the placement of the unmasked bomb regions 74. FIG. 12B shows an unmasked bomb region 74 abutting the border of the protection mask and forming a U-shaped indentation between the lateral extensions 70a,70b of the protection mask. The indentation has concave boundaries, so the etchant will not act on this portion of the protection mask, but will undercut the convex corners of the protection mask. FIG. 12C shows an unmasked bomb region 74 abutting the border of the protection mask and forming a planar boundary.

FIGS. 13A–13D illustrate embodiments of a corner protection mask that are advantageous for long, thin feature areas. In FIGS. 13A–13C, each protection mask abuts four chip corners of four chip masks via two shared lateral extensions 70a,70b (shown only on FIG. 13A). The protection mask extends into the intersection of the four chip mask corners and also extends away from the intersection, forming two extension arms 77a,77b. The protection mask forms a central body 72 extending north-south. The unmasked bomb regions 74 are enclosed by the protection mask and also form U-shaped indentations. Only the four convex corners of the extension arms 77a,77b are vulnerable to undercutting at the start of etching. In FIG. 13D, the lengthwise direction of the central body 72 is oriented parallel to the lengthwise side of the protected chips.

Figure 14:
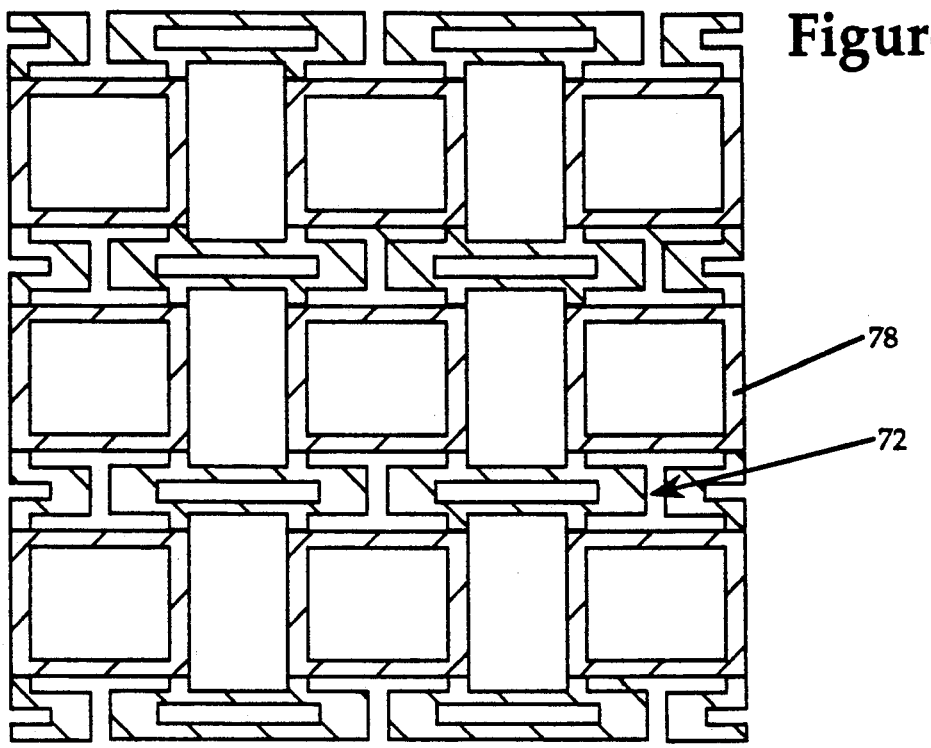
FIG. 14 shows an array of chip masks with corner protection masks oriented in one direction and parallel to one another.
Figure 15:
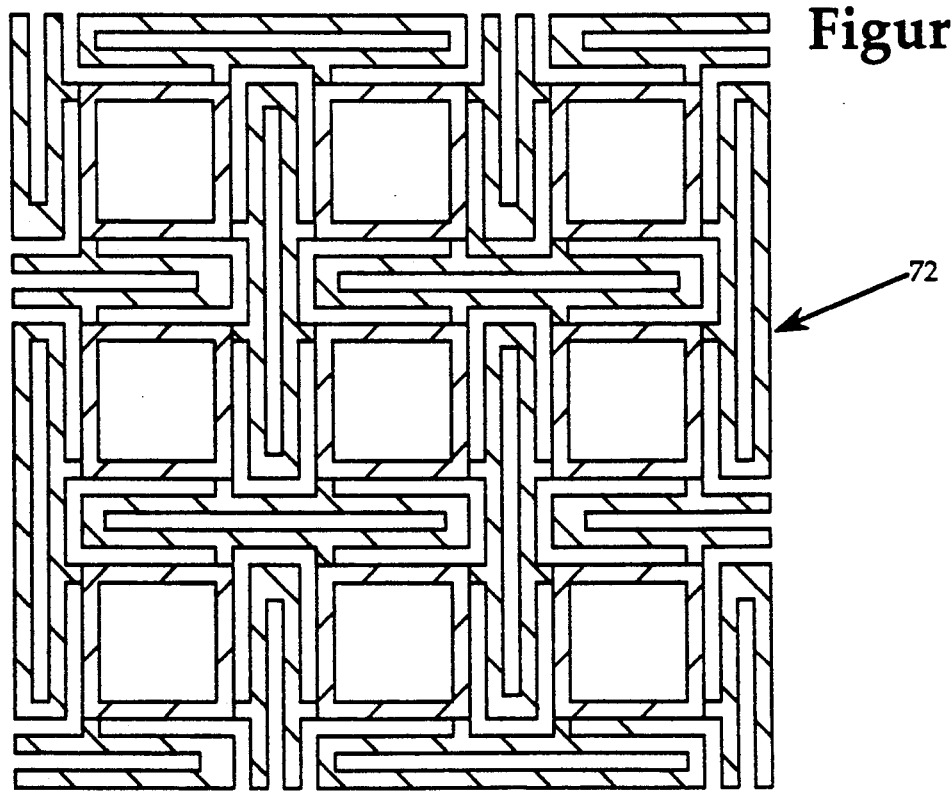
FIG. 15 shows an array of chip masks with corner protection masks oriented alternately normal to one another.

FIGS. 14 and 15 illustrate two embodiments of how corner protection masks can be oriented with an array of window masks 78 in a mask pattern. FIG. 14 shows an arrangement for thin film windows 78 with narrow frames in which the protection mask central bodies 72 are oriented parallel to one another. FIG. 15 shows a particularly useful arrangement of protection masks, where the central bodies 72 are oriented in two directions alternately in the array. This two-way arrangement permits the protection mask extension arms to extend the length of at least one feature area, and preferably two, thereby using wafer space more efficiently and increasing the etch time and groove depth.

FIGS. 8, 10, 12 and 13 illustrate the variety of corner protection masks that are particularly useful for mask patterns with large chip mask areas. The present invention is also useful for mask patterns where the chip areas are small in comparison to the non-chip areas, as shown in FIG. 6. In this case, the corner protection masks are used to insure that the chip corners are not undercut while very deep, wide grooves are etched. The loss of any chip area by undercutting is especially serious because the chip areas are very small originally. In these small chip patterns, the corner protection masks are as large as or larger than the chip masks.

FIGS. 16A–16G illustrate embodiments of corner protection masks suitable for chip patterns with small chip mask areas and deep, wide grooves. Small chip patterns present a problem, because conventional corner extensions from an already small area are usually very narrow and are undercut too quickly, or before deep grooves are etched. The corner protection masks of the present invention avoid this problem by extending from the chip corners and sides both laterally and in a direction parallel to the corner side of the chip and by including unmasked bomb regions.

Figure 16A:
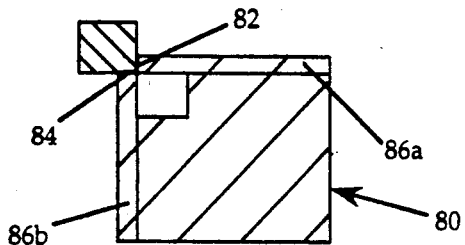
FIGS. 16A-16G show embodiments of corner protection masks suitable for small chip mask patterns.
Figure 16B:
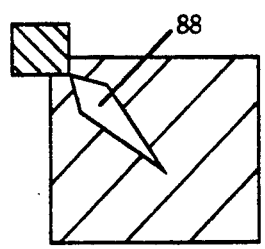

FIGS. 16A and 16B illustrate an embodiment of a corner protection mask 80 that extends from a corner point and laterally from segments 82,84 along both corner sides of the corner point, forming lateral extensions 86a,86b. The protection mask 80 then extends from the lateral extensions 86a,86b in directions parallel to the respective segments 82,84 of the corner sides (the sides which the protection mask abuts).

FIGS. 16A–16G illustrate that the unmasked bomb regions 88 may be of different shapes, sizes, and orientations. The unmasked bomb regions 88 typically have planar or concave boundaries, which are etch-stop planes or slow-etching planes (planes that etch more slowly than convex corners). The etchant must not act on the unmasked bomb regions at the start of etching; the bomb regions are used to expose new convex corners as the etch fronts move to the chip corners. The unmasked bombs of these protection masks allow deep, wide grooves to be etched in a wafer, while still protecting the very small chip areas from undercutting.

Figure 16C:
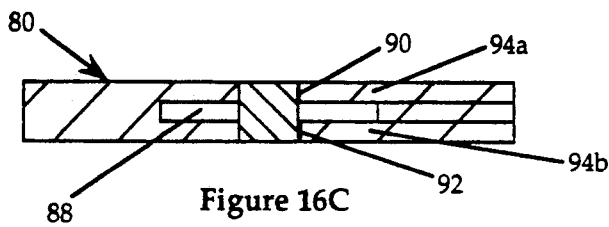
Figure 16D:
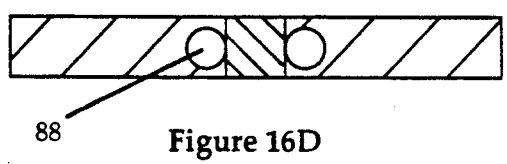
Figure 16E:
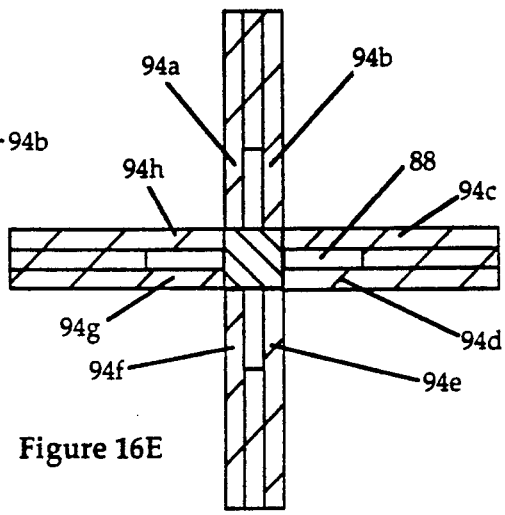

FIGS. 16C–16D show an embodiment of a corner protection mask 80 that abuts two corner points and extends laterally from segments 90,92 along the common side of the corner points, forming lateral extensions 94a,94b from the corner points and corner sides. The protection mask 80 continues to extend from the lateral extensions 94a,94b in a second direction, parallel to the common side of the chip. Typically, two protection masks 80 abut two opposing sides of the chip. The unmasked bomb regions 88 formed in the protection masks abut the chip mask sides and are shown in two possible embodiments, rectangular and circular. FIG. 15E shows another embodiment in which a corner protection mask has eight lateral extensions 94a–h oriented in four directions (N, S, E, W), abutting four sides of a chip mask, with an unmasked bomb region 88 abutting each chip side.

Figure 16F:
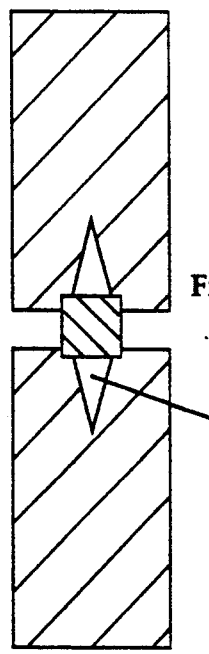
Figure 16G:
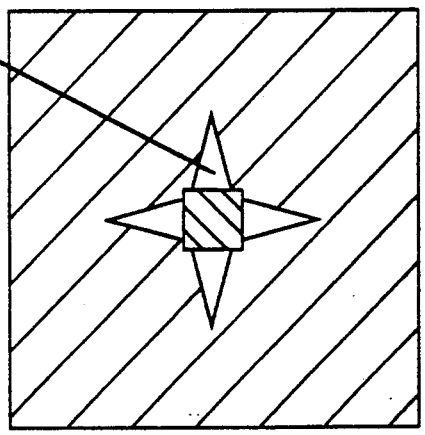

FIG. 16F shows an embodiment of a corner protection mask that extends from two corner points of the chip mask and extends laterally from segments along both sides of each corner point. The protection mask continues to extend in directions parallel to the respective corner sides to merge into one polygonal mask. An unmasked bomb region 88 abuts the chip mask side between the two corner points. FIG. 16G shows a protection mask that abuts all four corners of the chip mask and extends laterally from both corner sides of each corner point. The protection mask continues to extend in directions parallel to the corner sides and merges to form one polygon with unmasked bomb regions 88 abutting each chip mask side.

FIGS. 17 and 18 provide examples of corner protection masks suited to chip masks of different shapes and patterns. All protection masks abut at least one corner point and extend laterally from a segment along one or both corner sides of a chip corner, forming at least one lateral extension. The protection mask then changes direction and extends from the lateral extension in a second direction, parallel to the corner side of the chip. The protection masks include unmasked bomb regions to expose new convex corners for etching, thereby facilitating the elimination of the protection mask.

FIGS. 17A-17C show embodiments of a corner protection mask that abuts a chip corner point and extends laterally from a segment along one corner side of the chip corner, forming a lateral extension 96. The corner protection mask extends from the lateral extension 96 in a second direction, parallel to the corner side of the chip, forming an extension arm 100 that is spaced away from the adjacent chip side. An unmasked spacer region 102 occupies the space between an extension arm 100 and the adjacent chip side; therefore, the width of the extension arm 100 is less than the length of the lateral extension 96. FIG. 17C illustrates an embodiment of two protection masks arranged to protect two corners of a thin rectangular chip mask.

In FIGS. 17A and 17C, the protection mask then extends from the lateral extension 96 in a third direction, parallel to the corner side of the chip, forming two mask extensions 98a,98b that abut the sides of another chip mask. In FIG. 17B, only one mask extension 98c is formed that abuts the side of an adjacent chip. These extensions 98a,98b,98c do not function as corner protectors, but are a lithography design feature to help align the mask templates.

Unmasked bomb regions 104 form U-shaped boundaries in FIGS. 17A and 17C and form an L-shaped boundary in FIG. 17B; the bomb regions 104 are concave or planar ($\leq 180°$). At the start of etching, the protection masks are undercut at the convex corners of the extension arms 100, not at the concave or planar faces bounding the unmasked bomb regions 104.

Figure 18A:
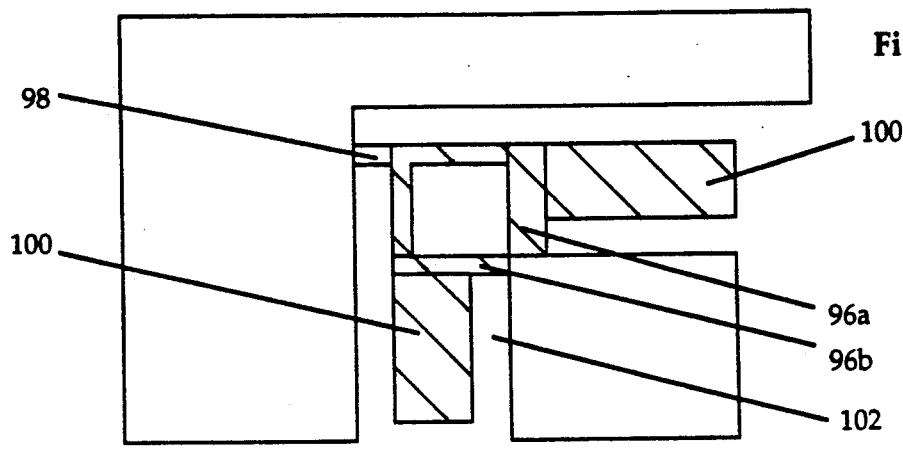
Figure 18B:
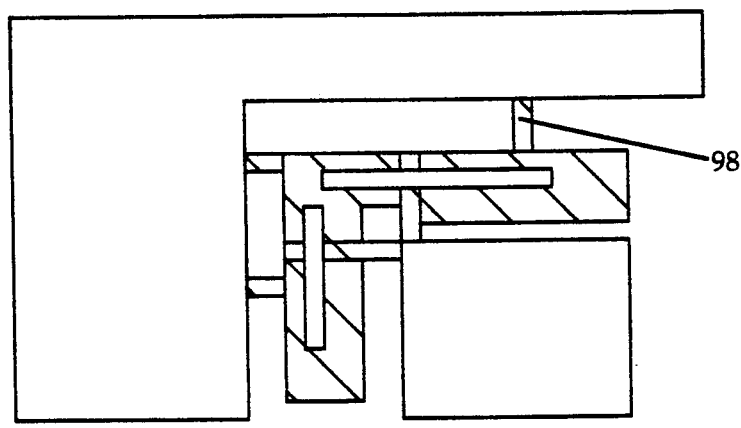
Figure 18C:
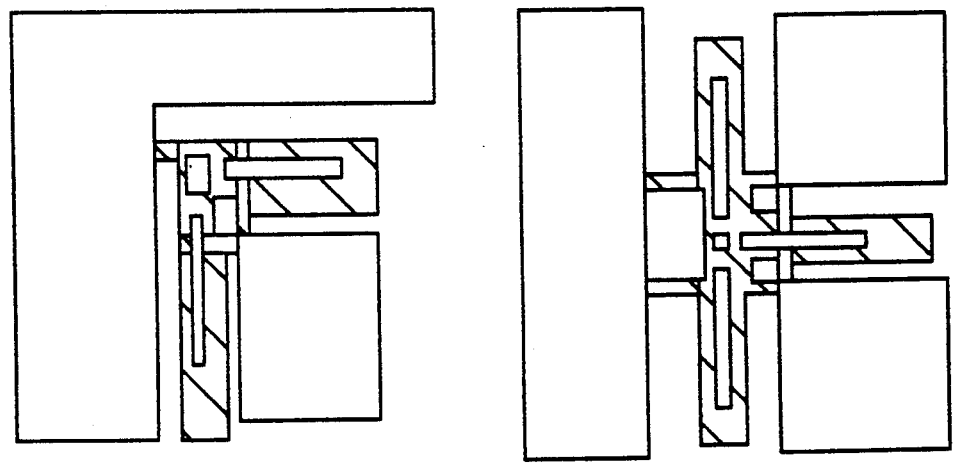
Figure 18D:
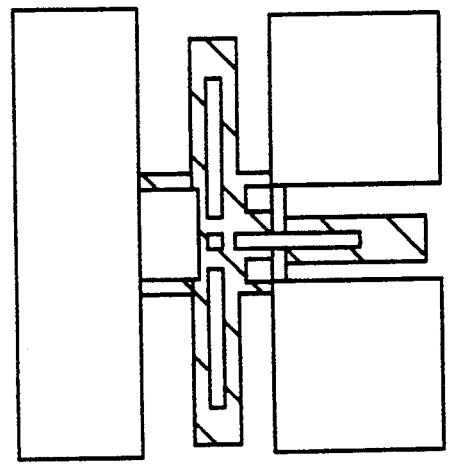
Figure 19A:
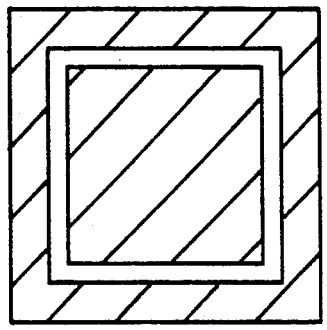
FIGS. 19A–19G show chip mask design patterns presently unachievable with conventional corner compensation structures.
Figure 19B:
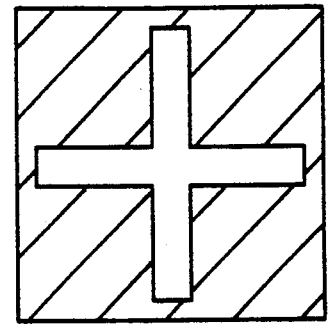
Figure 19C:
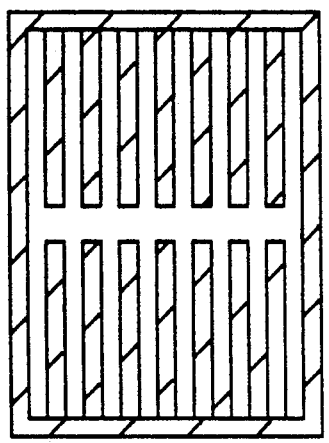
Figure 19D:
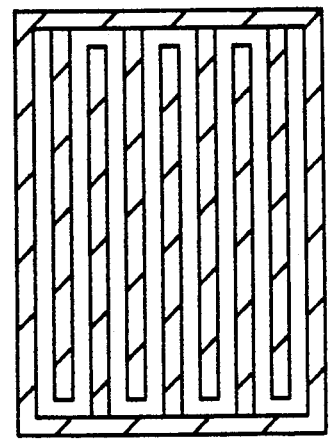
Figure 19E:
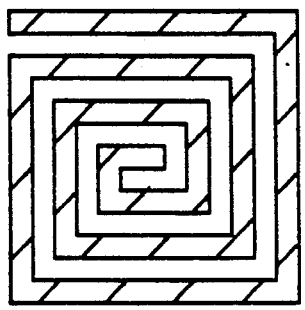
Figure 19F:
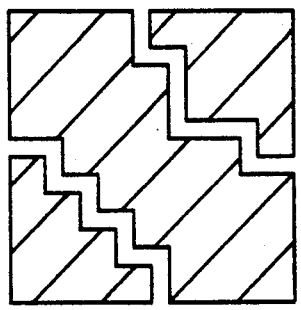
Figure 19G:
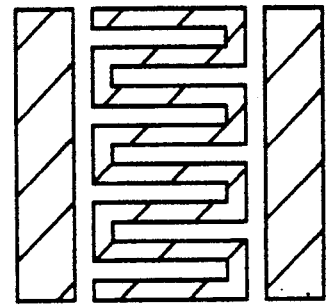

FIGS. 18A-18D illustrate embodiments of a corner protection mask that extends laterally from segments along both corner sides of a chip corner, forming lateral extensions 96a,96b. The protection mask extends from each lateral extension in a second direction and a third direction, both directions parallel to the adjacent corner side of the chip. The protection mask forms extension arms 100 by extending in the third direction, and the extension arms 100 are spaced away from the corner sides of the chip by unmasked spacer regions 102. The protection masks enclose at least one unmasked bomb region 104 that abuts a corner point of the protected chip mask. The protection masks include mask extensions 98 that abut the sides of adjacent, unprotected chip masks to aid in aligning the chip mask and protection mask templates. FIG. 18D show a protection mask embodiment that abuts two chip corners of two chips.

The design of the present protection masks is particularly useful for microfine and elaborate chip mask structures. FIGS. 19A-19G illustrate some elaborate chip design patterns that are presently unachievable due to inadequate conventional corner protection structures, but which are possible with the present design of corner protection masks.

Figure 20:
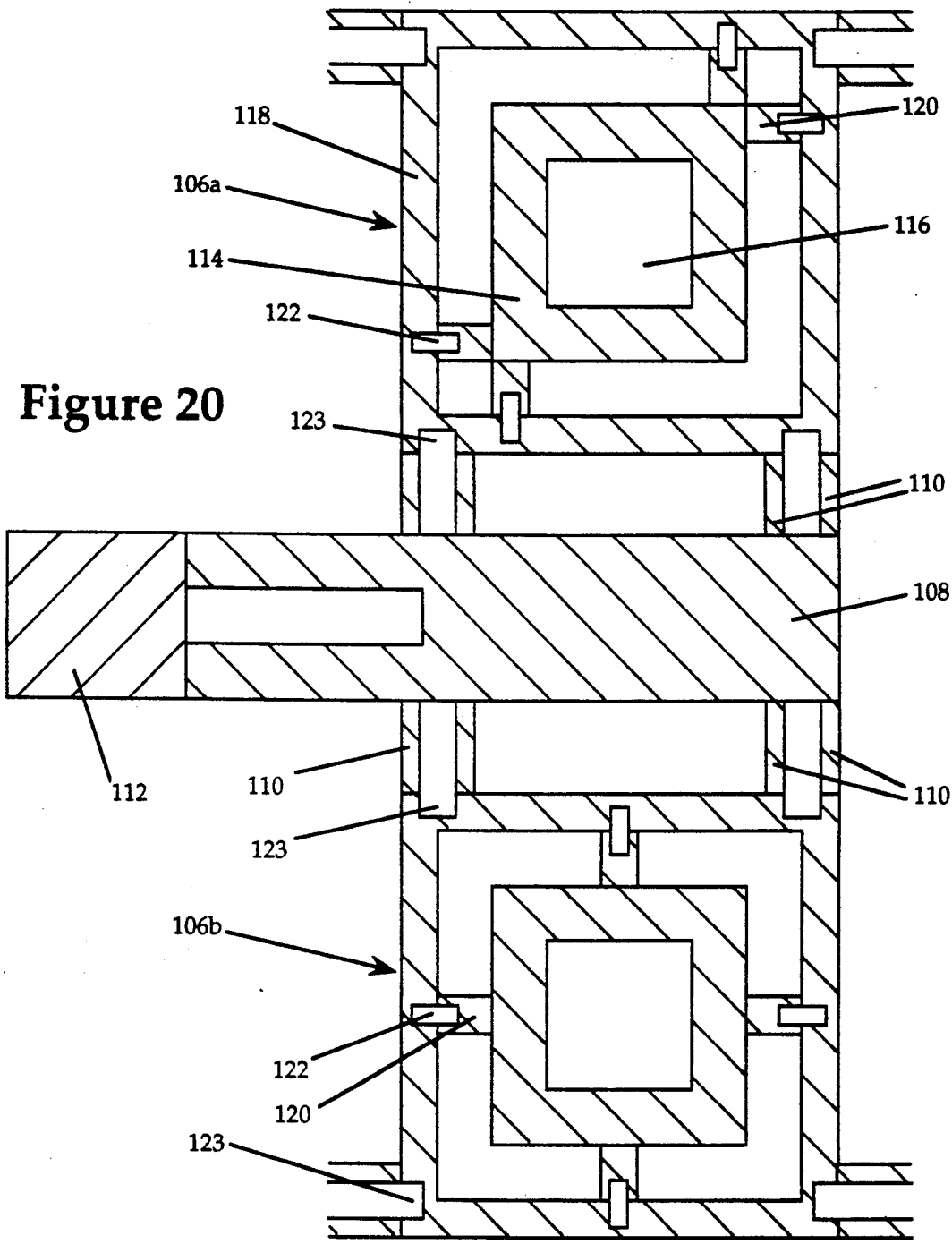
FIG. 20 illustrates an expanded embodiment of a primary corner protection mask and auxiliary protection masks.

The corner protection masks for small chip patterns can be more elaborate, as shown in FIG. 20. In this embodiment, two auxiliary protection masks 106a,106b are connected to a primary protection mask 108 of the type represented in FIG. 16C. Ancillary lateral extensions 110 connect the auxiliary protection masks 106a,106b to the primary protection mask 108, which in turn abuts a chip mask 112. The ancillary extensions 110 must abut at least the convex corners of the primary mask 108, so that the primary mask 108, will not be undercut until the auxiliary masks 106a,106b are etched away.

The auxiliary protection mask 106a is comprised of nested concentric frames. The innermost frame 114 encloses an unmasked bomb region 116 and must have at least one exposed convex corner where etching of the corner protection mask commences. The innermost frame 114 is enclosed by one or more outer frames 118, with unmasked space separating the inner and outer frames 114,118. The innermost frame 114 is connected to the next outer frame 118 by one or more lateral connectors 120. FIG. 20 shows two possible positions for lateral connectors 120—abutting the inner frame's corners, as in the top auxiliary mask 106a, or abutting the inner frame's sides, as in the bottom auxiliary mask 106b.

Figure 21:
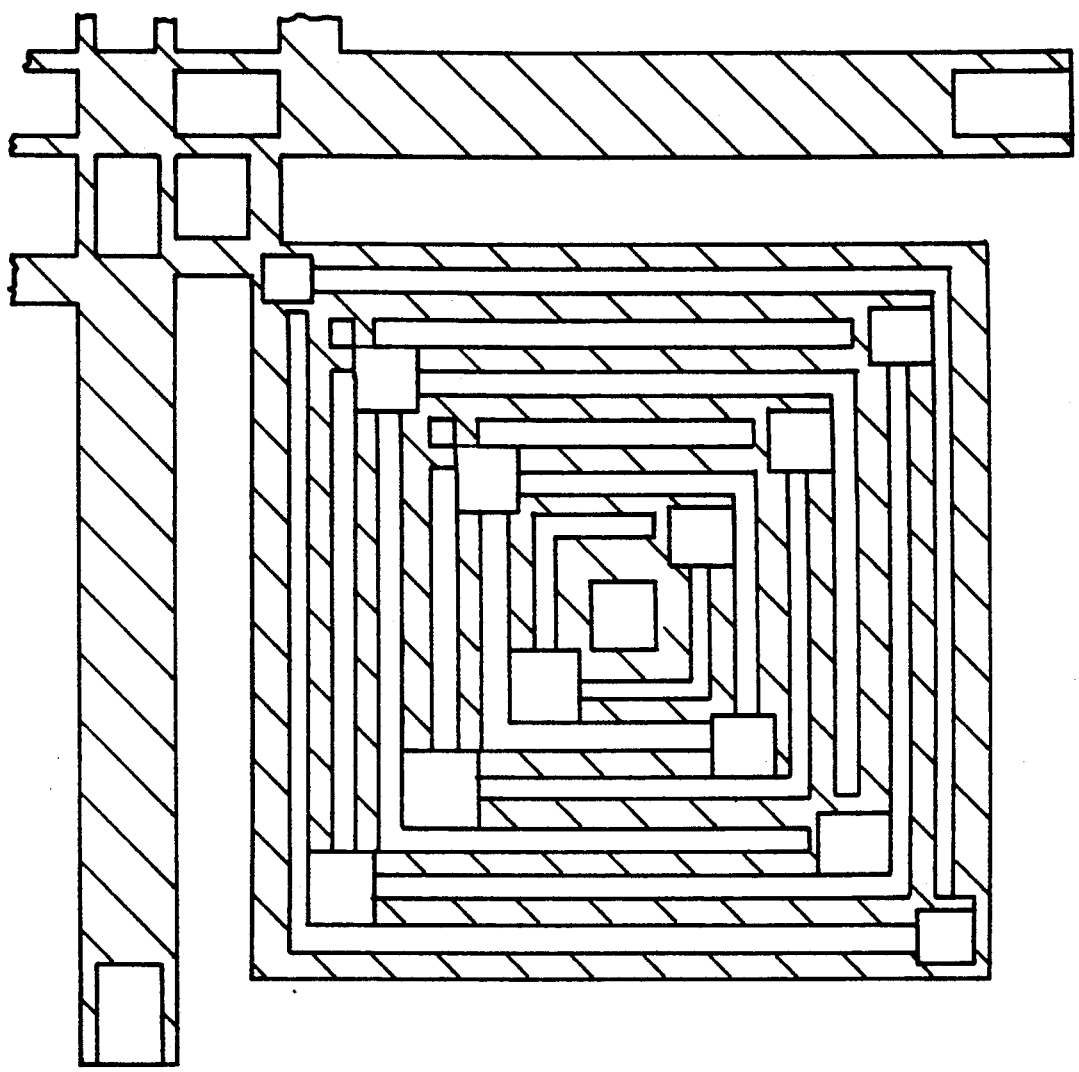
FIG. 21 shows an array of chip masks with primary and auxiliary corner protection masks.

Unmasked bomb regions 122 are formed in the junction of the lateral connectors 120 and the adjoining outer frame 118. After the innermost frame 114 has been etched away, and as the etch fronts move outward to erode the lateral connectors 120, the bomb regions 122 "open up" the outer frame 118, exposing convex corners for etching. Additional bomb regions 123 are formed in the outer frame 118, forming U-shaped indentations, which cut into the outer frame at a distance such that the two bomb regions 122 and 123 "overlap" along a line parallel to the sides of the outer frame. Otherwise, without the bomb regions 123 in the outer frames 118 and the bomb regions 122 at the junctures of the lateral connectors 120 and outer frames 118, the etch fronts would be effectively stopped at the concave inner boundaries of the outer frame 118. FIG. 21 is a schematic illustration to show the general arrangement of an array of small chip masks and primary protection masks connected to auxiliary masks with multiple outer frames.

Figure 22A:
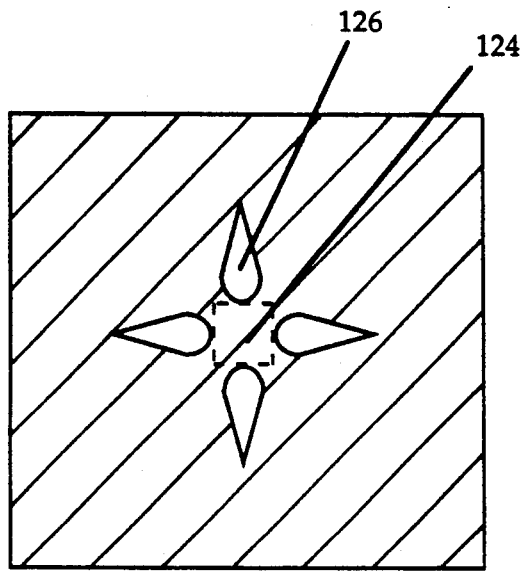
FIGS. 22A–22C show embodiments of corner protection masks with self-aligning feature areas.
Figure 22B:
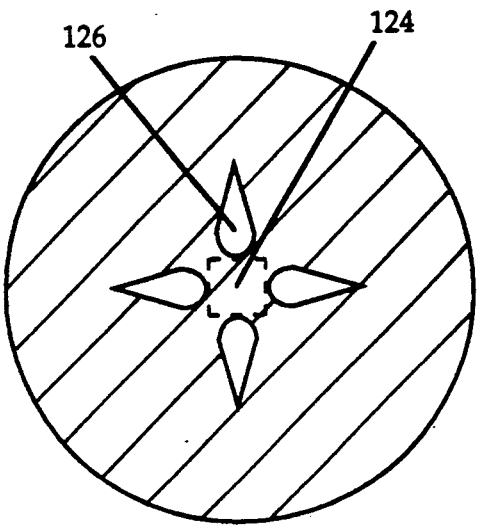
Figure 22C:
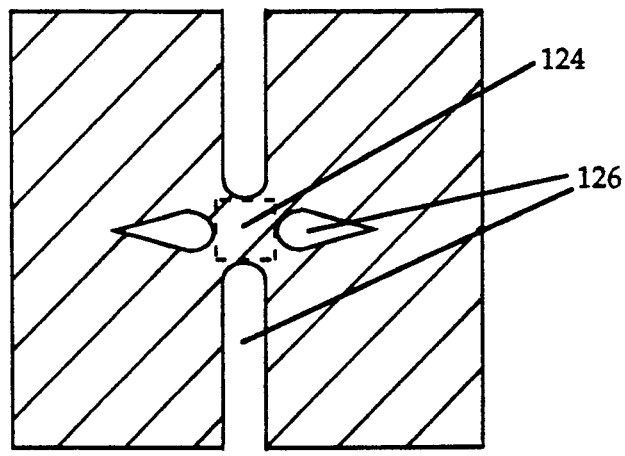

The present invention can be taken one step further to create self-aligning chip areas. FIGS. 22A-22C illustrate several embodiments of self-aligning corner protection masks. Since anisotropic etching exploits the preferential etching of certain crystal planes, the self-aligning protection mask is etched until the desired feature area appears, bounded by etch-stop or slow-etching planes. The corner protection masks cover and surround the potential feature areas 124.

The protection masks include unmasked bomb regions 126 that are bounded by etch-stop or slow-etching planes which abut, but do not overlap, the potential feature areas 124. The unmasked bomb regions 126 may abut the border of the protection mask, as in FIG. 22C, and merge with the surrounding unmasked wafer space. The mask pattern essentially comprises self-aligning protection masks, which are etched until the potential feature area 124 is defined. The process of anisotropic etching automatically produces feature areas with a predictable orientation.

The foregoing description of the embodiments of the invention is presented for purposes of illustration only and is not intended to be exhaustive or to limit the invention to the precise form disclosed. Changes in the specifically described embodiments can be carried out without departing from the scope of the invention, which is intended to be limited only by the scope of the appended claims.

I claim:

1. A device for protecting corners of polygonal feature areas on a wafer that will undergo anisotropic etching, which comprises: a mask pattern on the wafer, wherein the mask pattern comprises:
   (1) at least one feature area mask, wherein each feature area mask has at least one outer convex corner, and each corner is defined by two corner sides intersecting at a corner point; and
   (2) at least one primary corner protection mask, which is to be undercut, wherein the corner protection mask
      (i) abuts at least one corner point of the feature area mask and a segment along at least one feature area corner side,
      (ii) extends laterally from the corner side in a first direction, forming a lateral extension,
      (iii) extends from the lateral extension in a second direction, parallel to the corner side, and
      (iv) forms at least one unmasked bomb region in the protection mask, wherein the unmasked region has at least one concave or planar boundary that etches more slowly than convex corners; and wherein the dimensions and geometry of the corner protection mask are such that, during anisotropic etching, exposed convex boundaries of the protection mask are undercut back to the feature area mask corners at about the same time that grooves etched into the wafer reach a desired depth and width.

2. A device for protecting corners as recited in claim 1, wherein each protection mask has two lateral extensions which abut two feature area corners of one side of the feature area mask, wherein at least one unmasked bomb region abuts at least one point of the feature area side between the two abutted feature area corners, and wherein two protection masks abut two opposing sides of the feature area mask.

3. A device for protecting corners as recited in claim 1, wherein each protection mask has at least six lateral extensions which abut the feature area corners of at least three sides of the feature area mask, and wherein at least one unmasked bomb region abuts at least one point of each feature area side between two abutted feature area corners.

4. A device for protecting corners as recited in claim 1, wherein the corner protection mask abuts segments along both corner sides of each abutted feature area corner point, whereby the corner protection mask forms two lateral extensions from each abutted corner, and wherein at least one unmasked bomb region abuts at least one point of the feature area mask.

5. A device for protecting corners as recited in claim 4, wherein at least one unmasked bomb region abuts at least one corner point of the feature area mask.

6. A device for protecting corners as recited in claim 1, wherein the corner protection mask has a polygonal shape and abuts both corner sides of at least two corner points of the feature area mask, and wherein at least one unmasked bomb region abuts at least one point of each feature area side that is common to two abutted corners of the feature area mask.

7. A device for protecting corners as recited in claim 1, wherein the feature area mask has four corners, and the corner protection mask has a polygonal shape and abuts both corner sides of each of the four corners of the feature area, surrounding the feature area mask, and wherein at least one unmasked bomb region abuts at least one point of each side of the feature area mask.

8. A device for protecting corners as recited in claim 1, wherein the width of the grooves etched into the wafer is less than about 200 microns, and wherein the length of the feature area mask is greater than about 200 microns.

9. A device for protecting corners as recited in claim 1, wherein the width of the grooves etched into the wafer is greater than about 200 microns, and wherein the length of the feature area mask is less than about 200 microns.

10. A device for protecting corners as recited in claim 1, wherein the corner protection mask abuts segments along both corner sides of each protected feature area corner point, whereby the corner protection mask forms two lateral extensions from each abutted corner, and wherein the corner protection mask
    (v) further extends from each lateral extension in a third direction, parallel to the respective corner sides, forming at least two extension arms,
    wherein an unmasked spacer region is formed between each extension arm and the respective corner side, whereby the width of the extension arm is less than the length of the lateral extension, and wherein at least one unmasked bomb region is formed in each extension arm.

11. A device for protecting corners as recited in claim 10, wherein at least four feature area masks form a two-dimensional array, wherein each corner protection mask forms four extension arms and abuts at least two corners of the feature area masks, whereby each extension arm is positioned between the sides of two feature area masks.

12. A device for protecting corners as recited in claim 1, wherein the corner protection mask abuts a segment along one corner side of each protected feature area corner point, whereby the corner protection mask forms one lateral extension from each protected corner, and wherein the corner protection mask
    (v) further extends from the lateral extension in a third direction, parallel to the corner side, forming at least one extension arm, and
    wherein an unmasked spacer region is formed between the extension arm and the corner side, whereby the width of the extension arm is less than the length of the lateral extension.

13. A device for protecting corners as recited in claim 12, wherein at least one unmasked bomb region abuts the border of the protection mask and merges with unmasked space surrounding the protection mask, forming an indentation in the protection mask.

14. A device for protecting corners as recited in claim 13, wherein at least one unmasked bomb region is formed in the side of the protection mask distal to the extension arm and forms a U-shaped indentation in the protection mask.

15. A device for protecting corners as recited in claim 13, wherein at least one unmasked bomb region is formed at a corner of the protection mask distal to the extension arm and forms an L-shaped indentation in the protection mask.

16. A device for protecting corners as recited in claim 1, wherein the corner protection mask abuts a segment along one corner side of each protected feature area corner point, whereby the corner protection mask forms one lateral extension from each protected corner; wherein the corner protection mask
- (v) forms a first extension arm while extending from the lateral extension in the second direction, and
- (vi) forms a second extension arm by extending from the lateral extension in a third direction, parallel to the corner side and to the second direction, whereby the first and second extension arms extend in opposite directions;

wherein an unmasked spacer region is formed between the second extension arm and the feature area corner side, whereby the width of the second extension arm is less than the length of the lateral extension; and wherein the extension arms and the lateral extension form a central body of the protection mask.

17. A device for protecting corners as recited in claim 16, wherein the corner protection mask abuts at least two corner points of at least two feature area masks and forms at least two lateral extensions from the abutted corners of the feature area masks, and wherein the lateral extensions and extension arms form the central body.

18. A device for protecting corners as recited in claim 17, wherein at least one unmasked bomb region abuts the border of the protection mask and merges with unmasked space surrounding the protection mask, forming a U-shaped indentation in the protection mask.

19. A device for protecting corners as recited in claim 17, wherein at least one unmasked bomb region abuts the border of the protection mask and merges with unmasked space surrounding the protection mask, forming an L-shaped indentation in the protection mask.

20. A device for protecting corners as recited in claim 17, wherein at least one unmasked bomb region is bounded by a planar boundary in the protection mask, and wherein the extension arms are not formed between facing sides of the feature areas, and the lengthwise direction of the central body extends the length of at least one feature area.

21. A device for protecting corners as recited in claim 16, wherein the corner protection mask abuts at least four corner points of at least four feature area masks and forms at least two lateral extensions from the abutted corners of the feature area masks, and wherein the lateral extensions and extension arms form the central body.

22. A device for protecting corners as recited in claim 21, wherein a plurality of feature area masks forms a two-dimensional array, and wherein the lengthwise directions of the central bodies of the protection masks are parallel to one another.

23. A device for protecting corners as recited in claim 21, wherein a plurality of feature area masks forms a two-dimensional array, and wherein the lengthwise directions of the central bodies of the protection masks alternate, whereby a lengthwise direction of a first central body is parallel to one side of the feature area mask, and a next successive lengthwise direction of a second central body is parallel to an adjacent side of the feature area mask.

24. A device for protecting corners as recited in claim 1, wherein the mask pattern further comprises:
- (3) at least one auxiliary corner protection mask, and
- (4) at least one ancillary lateral extension connecting the primary protection mask to the auxiliary corner protection mask on at least one corner point of the primary protection mask; and wherein the convex corners of the primary protection mask are not undercut by the etchant until the auxiliary protection mask is undercut.

25. A device for protecting corners as recited in claim 24, wherein the auxiliary protection mask comprises:
- (a) an innermost polygonal frame enclosing an unmasked bomb region;
- (b) at least one outer polygonal frame enclosing a second unmasked bomb region and the innermost frame, wherein the innermost and outer frames are concentric, and at least one convex corner of the inner frame is exposed for etching, so that etching begins at the inner frame's convex corner, and the etching fronts undercut the inner frame and continue outward to successive outer frames; and
- (c) at least one lateral connector connecting each outer frame to the frame immediately enclosed by the outer frame, wherein an unmasked bomb region is formed in a juncture of each lateral connector and outer frame, whereby the elimination by etching of the lateral connector exposes convex corners in the outer frame.

26. A device for forming a self-aligning feature area with well-defined corners from a potential feature area on a wafer that will undergo anisotropic etching, which comprises:

a mask pattern on the wafer, wherein the mask pattern comprises:
- (1) at least one potential feature area, wherein the potential feature area is bounded by planes that etch more slowly than convex corners or are etch-stop planes,
- (2) at least one corner protection mask covering and extending from the potential feature area, and
- (3) at least one unmasked bomb region formed in a portion of the corner protection mask that does not include the potential feature area, wherein the unmasked region abuts at least one side of the potential feature area and is bounded by planes that etch more slowly than convex corners or are etch stop planes; and wherein the dimensions and geometry of the corner protection mask are such that, during anisotropic etching, the protection mask is undercut back to the potential feature area at about the same time that grooves of a desired depth and width are etched into the wafer.

27. A method for protecting corners of polygonal feature areas on a wafer that will undergo anisotropic etching, which comprises: (a) forming a mask pattern on the wafer, wherein the mask pattern comprises:
- (1) at least one feature area mask, wherein each feature area mask has at least one outer convex corner, and each corner is defined by two corner sides intersecting at a corner point; and
- (2) at least one primary corner protection mask, which is to be undercut, wherein the corner protection mask
  - (i) abuts at least one corner point of the feature area mask and a segment along at least one feature area corner side,
  - (ii) extends laterally from the corner side in a first direction, forming a lateral extension, (iii) extends from the lateral extension in a second direction, parallel to the corner side, and (iv) forms at least one unmasked bomb region in the protection mask, wherein the unmasked region has at least one concave or planar boundary that etches more slowly than convex corners;

wherein the dimensions and geometry of the corner protection mask are such that, during anisotropic etching, exposed convex boundaries of the protection mask are undercut back to the feature area mask corners at about the same time that grooves etched into the wafer reach a desired depth and width; and (b) etching the mask pattern on the wafer with an anisotropic etchant.

28. A method for protecting corners as recited in claim 27, wherein each protection mask has two lateral extensions which abut two feature area corners of one side of the feature area mask, wherein at least one unmasked bomb region abuts at least one point of the feature area side between the two abutted feature area corners, and wherein two protection masks abut two opposing sides of the feature area mask.

29. A method for protecting corners as recited in claim 27, wherein each protection mask has at least six lateral extensions which abut the feature area corners of at least three sides of the feature area mask, and wherein at least one unmasked bomb region abuts at least one point of each abutted feature area side.

30. A method for protecting corners as recited in claim 27, wherein the corner protection mask abuts segments along both corner sides of at least one corner point, whereby the corner protection mask forms two lateral extensions from each abutted corner, and wherein at least one unmasked bomb region abuts at least one point of the feature area mask.

31. A method for protecting corners as recited in claim 27, wherein the corner protection mask has a polygonal shape and abuts both corner sides of at least two corner points of the feature area mask, and wherein at least one unmasked bomb region abuts at least one point of each feature area side that is common to two abutted corners of the feature area mask.

32. A method for protecting corners as recited in claim 27, wherein the corner protection mask abuts segments along both corner sides of each protected feature area corner point, whereby the corner protection mask forms two lateral extensions from each abutted corner, and wherein the corner protection mask (v) extends from each lateral extension in a third direction, parallel to the respective corner sides, forming at least two extension arms, wherein an unmasked spacer region is formed between each extension arm and the respective corner side, whereby the width of the extension arm is less than the length of the lateral extension, and wherein at least one unmasked bomb region is formed in each extension arm.

33. A method for protecting corners as recited in claim 32, wherein at least four feature area masks form a two-dimensional array, wherein each corner protection mask forms four extension arms and abuts at least two corners of the feature area masks, whereby each extension arm is positioned between the sides of two feature area masks.

34. A method for protecting corners as recited in claim 27, wherein the corner protection mask abuts a segment along one corner side of the protected feature area corner point, whereby the corner protection mask forms one lateral extension from each protected feature area corner, and wherein the corner protection mask (v) further extends from the lateral extension in a third direction, parallel to the corner side, forming at least one extension arm, and wherein an unmasked spacer region is formed between the extension arm and the corner side, whereby the width of the extension arm is less than the length of the lateral extension.

35. A method for protecting corners as recited in claim 34, wherein at least one unmasked bomb region abuts the border of the protection mask and merges with unmasked space surrounding the protection mask, forming an indentation in the protection mask.

36. A method for protecting corners as recited in claim 27, wherein the corner protection mask abuts a segment along one corner side of the protected feature area corner point, whereby the corner protection mask forms one lateral extension from each protected feature area corner; wherein the corner protection mask (v) forms a first extension arm while extending from the lateral extension in the second direction, and (vi) forms a second extension arm by extending from the lateral extension in a third direction, parallel to the corner side and to the second direction, whereby the first and second extension arms extend in opposite directions;

wherein an unmasked spacer region is formed between the second extension arm and the feature area corner side, whereby the width of the second extension arm is less than the length of the lateral extension; and wherein the extension arms and the lateral extension form a central body of the protection mask.

37. A method for protecting corners as recited in claim 36, wherein the corner protection mask abuts at least two corner points of at least two feature area masks and forms at least two lateral extensions from the abutted corners of the feature area masks, and wherein the lateral extensions and extension arms form the central body.

38. A method for protecting corners as recited in claim 27, wherein the mask pattern further comprises:

(3) at least one auxiliary corner protection mask, (4) at least one ancillary lateral extension connecting the primary protection mask to the auxiliary corner protection mask on at least one corner point of the primary protection mask;

wherein the convex corners of the primary protection mask are not undercut by the etchant until the auxiliary protection mask is undercut.

39. A method for forming a self-aligning feature area with well-defined corners from a potential feature area on a wafer that will undergo anisotropic etching, which comprises:

(a) forming a mask pattern on the wafer, wherein the mask pattern comprises:

(1) at least one potential feature area, wherein the potential feature area is bounded by planes that etch more slowly than convex corners or are etch-stop planes, (2) at least one corner protection mask covering and extending from the potential feature area, and (3) at least one unmasked bomb region formed in a portion of the corner protection mask that does not include the potential feature area, wherein the unmasked region abuts at least one side of the potential feature area and is bounded by planes that etch more slowly than convex corners or are etch stop planes;

wherein the dimensions and geometry of the corner protection mask are such that, during anisotropic etching, the protection mask is undercut back to the potential feature area at about the same time that grooves of a desired depth and width are etched into the wafer; and (b) etching the mask pattern along predetermined planes with an anisotropic etchant until the corner protection mask is undercut back to the potential feature area.

* * * * *